United States Patent
Martens et al.

(10) Patent No.: US 7,568,138 B2
(45) Date of Patent: Jul. 28, 2009

(54) METHOD TO PREVENT FIRMWARE DEFECTS FROM DISTURBING LOGIC CLOCKS TO IMPROVE SYSTEM RELIABILITY

(75) Inventors: Adolf Martens, Weil im Schoenbuch (DE); Walter Niklaus, Stuttgart (DE); Dietmar Schmunkamp, Schoenaich (DE); Scott Barnett Swaney, Catskill, NY (US); Ching-Lung L. Tong, Highland Mills, NY (US); Tobias Webel, Schwaebisch-Gmuend (DE)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 11/459,942

(22) Filed: Jul. 26, 2006

(65) Prior Publication Data

US 2008/0028266 A1    Jan. 31, 2008

(51) Int. Cl.
 *G01R 31/28* (2006.01)
(52) U.S. Cl. ...................................... 714/726; 714/744
(58) Field of Classification Search ....................... None
See application file for complete search history.

(56) References Cited

OTHER PUBLICATIONS

U.S. Appl. No. 11/055,160, filed Feb. 10, 2005, Fields et al.
U.S. Appl. No. 11/054,988, filed Feb. 10, 2005, Bishop et al.
U.S. Appl. No. 11/055,258, filed Feb. 10, 2005, Eisen et al.
U.S. Appl. No. 11/055,675, filed Feb. 10, 2005, Fields et al.
U.S. Appl. No. 11/055,404, filed Feb. 10, 2005, Fields et al.

*Primary Examiner*—Cynthia Britt
*Assistant Examiner*—Guerrier Merant
(74) *Attorney, Agent, or Firm*—Yee & Associates, P.C.; Libby Z. Handelsman

(57) ABSTRACT

A computer implemented method and data processing system are provided for preventing firmware defects from disrupting logic clocks. In response to a firmware interface requesting a scan operation for a functional unit, protection logic allows a scan enable to activate to the functional unit only if the logic clocks are stopped to that functional unit, otherwise the scan enable is not activated, an error is indicated, and an interrupt is presented to firmware. Also, in response to a command from a firmware interface to stop the logic clocks to a functional unit, protection logic allows the clocks to be stopped to the functional unit only if the functional unit is already indicating a catastrophic error, otherwise the clocks are not stopped, an error is indicated, and an interrupt is presented to firmware.

6 Claims, 20 Drawing Sheets

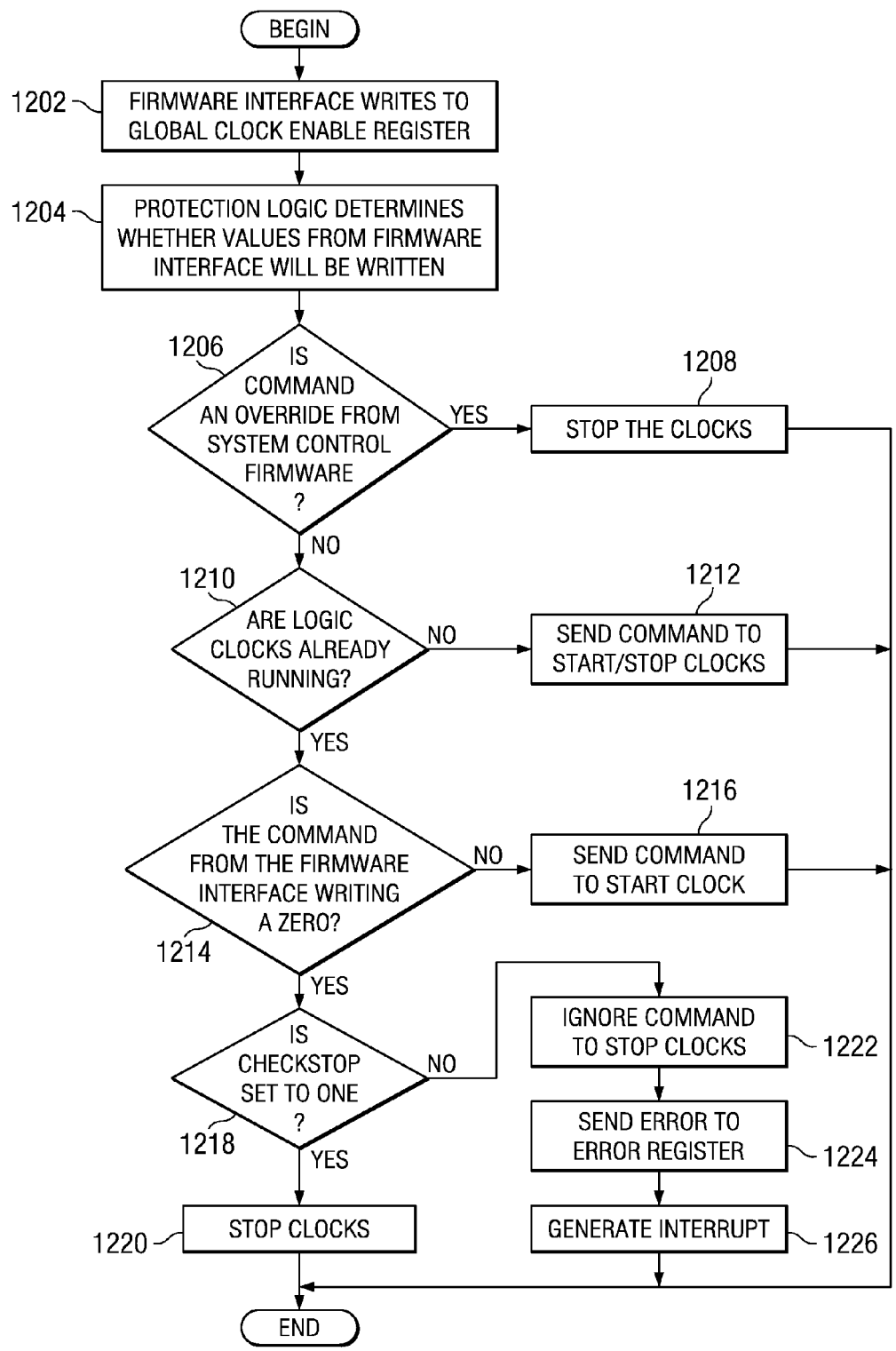

METHOD TO PREVENT FIRMWARE DEFECTS FROM DISTURBING LOGIC CLOCKS TO IMPROVE SYSTEM RELIABILITY

BACKGROUND OF THE INVENTION

1. Technical Field

The present application relates generally to firmware defects. More specifically, the present application is directed to a computer implemented method and data processing system for preventing firmware defects from disturbing logic clocks to improve system reliability.

2. Description of Related Art

Most data processing systems use mechanisms for detecting, and possibly diagnosing, errors, as well as provide for the possibility of recovering from an error. These two functions are usually distinct, requiring different hardware and software mechanisms.

The Reliability, Availability, and Serviceability (RAS) concept, as implemented in hardware and software, is directed to preventing or recognizing system failures (Reliability), the ability to keep the system functioning in the event of failure (Availability), and the ability to fix the failure in a non-disruptive way (Serviceability). RAS may be addressed at various levels of system development; to diagnose design bugs during new product development, in manufacturing to identify bad parts during the system build, and to catch errors while the system is operating. RAS may also be directed to various types of failures, including system-level design oversights, logical errors, hard failures, such as hardware faults, or soft errors, such as data errors in memory or after data transfer due to external noise or circuit failure.

In some cases it is only necessary to recognize that an error has occurred. In others it is necessary to diagnose the error, that is, to specifically identify its source. Finally, in some cases it is desirable to remove or correct the error.

In large, scaleable computer systems, high-availability depends on the ability to detect and isolate failures. Once isolated, the failing component is fenced from the rest of the system. In order to determine the root cause and appropriate recovery or repair actions, data must be collected from the failing component while it is still in the failed state, without affecting the steady-state operation of the remaining functioning components in the machine.

First Failure Data Capture (FFDC) data may be analyzed real-time by problem analysis firmware, or transmitted to a remote support location and analyzed by a product support analyst. In designs which use Level Sensitive Scan Design (LSSD) latches, this FFDC normally requires stopping the logic clocks to only the failed component and scanning out the state of the latches from only the failed component.

Stopping clocks and scanning out the latch values from a failed component while the rest of the machine continues running requires separation of the clocking boundaries and scan chains. Fine granularity in scan domains is desirable to reduce the payload for many test or initialization functions. In large, scaleable, multi-node computer systems, the number of clocking boundaries and scan chains across all the chips in the system can be very large (thousands). The control for these clocking and scan chain boundaries is often distributed across the chips in the system due to the large number of I/O connections which would be required to independently control them all from a single chip or controller. System control firmware is then required to manage the distributed clocking and scan controls. The complexity of the system control firmware leaves it prone to defects, just like any other complicated software or firmware application.

If the clocks are inadvertently stopped to a component in the part of the machine which is still running, it will cause that part of the machine, or even the entire machine to fail. If a scan chain is accessed while logic clocks are still running, it will cause the corresponding component or the entire machine to fail. Because a defect in the system control firmware could cause the clocks to be stopped incorrectly or a scan chain accessed incorrectly, it is desirable to have a method to protect such firmware defects from disturbing components which are still running in the machine.

Other known solutions to this problem include using a dedicated clock-chip with hardware state machines to control the stopping and starting of each clock domain, and providing scan clocks to a targeted chip/scan chain only if logic clocks are turned off, or relying on firmware to explicitly validate checkstop status or clock-stop status before respectively stopping clocks or scanning a chain.

There are multiple disadvantages of the known method of using a dedicated clock chip. First, it is an additional part number in the chipset that makes up the machine, which adds cost and increases the footprint of the computing building blocks. Second, it requires many connections between the clock chip and all the clock domains and scan chains across all the chips, which again adds packaging cost and additional possible points of failure.

If the scan clocks are driven independently to each scan chain, chips with multiple scan chains must internally wire multiple sets of scan clocks. Because it is desirable to scan at fast frequencies for chip-level testing, the scan clock wiring requires some amount of "balancing" in the design, so multiple sets of scan clocks greatly increases the design effort of the scan clock distribution. This problem could be alleviated by using a separate scan enable signal for each scan chain and gating the scan clocks locally in each chip for each chain, but a separate scan enable signal for each chain dramatically increases the already heavy connection requirements from the clock chip. Encoding values may also help reduce connections, but then also reduces flexibility in selecting multiple scan chains at the same time for efficient test and initialization sequencing.

Relying on firmware to explicitly validate checkstop status or clock state does not provide complete protection from firmware bugs. Adopting a common practice in coding can reduce the likelihood of bugs, but does not eliminate them. And when a firmware bug does cause the machine to fail, it often fails such that the hardware appears to have had a problem instead of the firmware, which results in incorrect diagnostics and repair actions.

SUMMARY OF THE INVENTION

The different aspects of the illustrative embodiments provide a computer implemented method and data processing system for preventing firmware defects from disturbing logic clocks. One illustrative embodiment receives a request for a scan operation from a firmware interface for a functional unit. The request includes a scan chain length value and a ring select. The illustrative embodiment produces global scan clocks using the scan chain length value. The illustrative embodiment sets the value of a scan enable signal equal to one in response to the ring select being set equal to a ring select value of one and a global clock enable value being set equal to zero. The global scan clocks are gated with the scan enable signal to form local scan clocks.

Further illustrative embodiments set the value of a scan enable signal equal to zero in response to the ring select value being set to one and the global clock enable value being set equal to one. Then the illustrative embodiments generate an error in a register and generate an interrupt to the firmware interface.

Another illustrative embodiment receives a command to control a set of logic clocks from a firmware interface for a functional unit and the command includes a next register value. The illustrative embodiment determines if the set of logic clocks are currently running. The illustrative embodiment determines if the next register value is set equal to zero in response to the clocks currently running. The next register value being set equal to zero indicates stopping the clocks and the next register value being set equal to one indicates starting the clocks. The illustrative embodiment determines if a checkstop value is set equal to one in response to the next register value being set equal to zero. The illustrative embodiment stops the clocks in response to the checkstop value being set equal to one.

Further illustrative embodiments ignore the command in response to the checkstop value being set equal to zero. Then the illustrative embodiments send an error to an error register and generate an interrupt.

BRIEF DESCRIPTION OF THE DRAWINGS

The novel features believed characteristic of the illustrative embodiments are set forth in the appended claims. The aspects of the illustrative embodiments, however, as well as a preferred mode of use, further objectives and advantages thereof, will best be understood by reference to the following detailed description of an illustrative embodiment when read in conjunction with the accompanying drawings, wherein:

FIG. 12 illustrates a flowchart of the checkstop clock-stop protection operation for multiple functional units in accordance with an illustrative embodiment.

DETAILED DESCRIPTION OF THE PREFERRED EMBODIMENT

The illustrative embodiments provide a computer implemented method and data processing system to prevent firmware defects from disturbing logic clocks in a multi-core microprocessor chip to improve system reliability. First Failure Data Capture (FFDC) data is collected from failed components for diagnostics, which requires stopping logic clocks and extracting latch contents via LSSD scanning, while the remaining operational components in the system remain running. The clock control logic and scan control logic are distributed across all the chips in the system, each with a memory mapped register interface which is manipulated by system control firmware. Checkstop indications from each logical clock domain to the clock run control logic gate whether updates from system control firmware are honored to stop logical clock domains or not. Clock-running status is indicated to the scan control logic for each logical clock domain to gate whether firmware access is granted to the scan chains or not. Incorrect firmware actions which would potentially interrupt a running logic domain are detected, the actions blocked, and an interrupt reported back to system control firmware with status indicating a violation.

Figure 1:
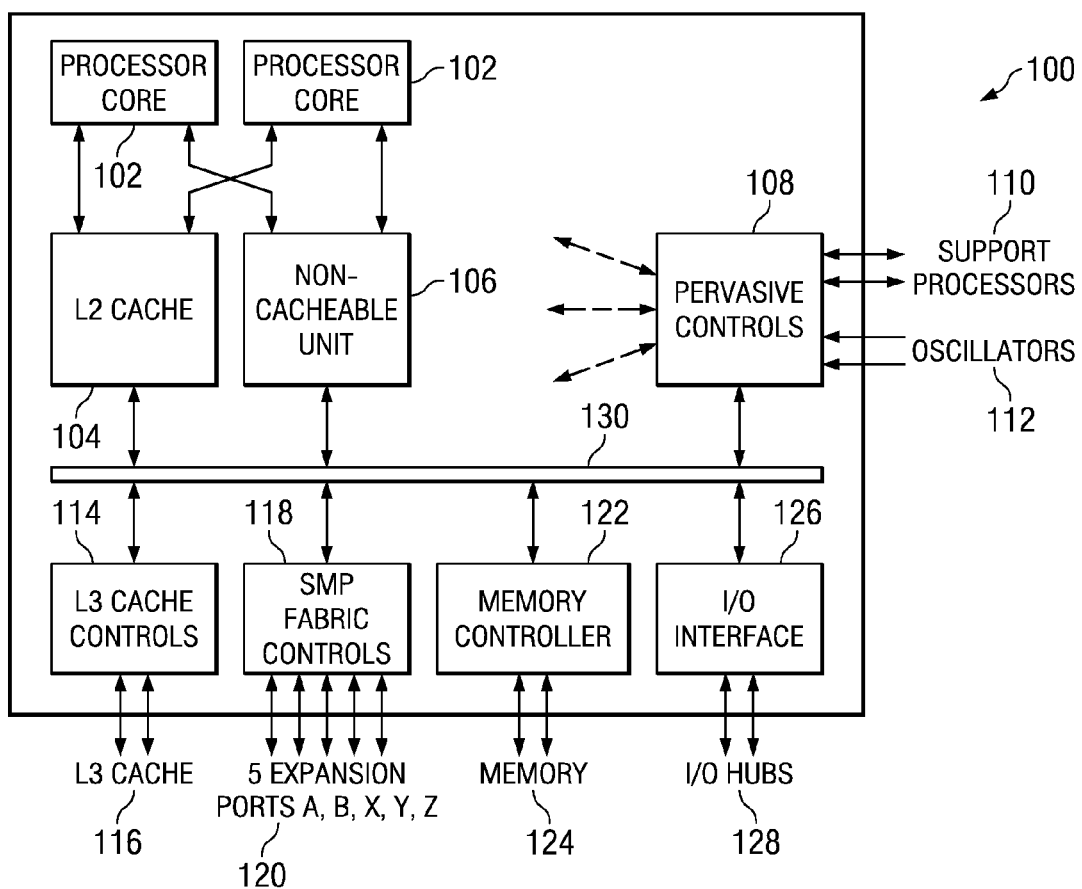
FIG. 1 is a representative processor chip in which the illustrative embodiments may be implemented.

FIG. 1 is a representative core processor chip in which the illustrative embodiments may be implemented. Processor chip 100 may have one or more processor cores 102. Each processor core may be simply referred to as a core. A processor core may have multithreading capability, error detection and recovery functions, numerous general purpose registers (GPR) and special purpose registers (SPR).

In accordance with an illustrative embodiment, processor core 102 may be connected to level 2 (L2) cache 104 and the non-cacheable unit (NCU) 106. NCU 106 may handle store commands by placing command, address and data received from processor core 102 onto fabric bus 130 for storage to main memory. Such stores may alternatively be to memory-mapped I/O or registers. NCU 106 may handle load commands by placing command and address received from processor core 102 onto fabric bus 130 for access to memory or memory mapped I/O or registers, and receiving returned data from fabric bus 130. Access to memory that may be susceptible to frequent accesses later may be stored to L2 cache 104 in order to reduce latency of future operations performed by processor core 102.

L2 104 may similarly provide access to its contents via fabric bus 130 which may interconnect to other chips on the same board, and also beyond the board upon which processor chip 100 is placed. A nearby, but off-chip level 3 (L3) cache 116 may be provided. Controls governing access between processor core 102 and L3 cache 116 are in L3 cache controls 114. Similarly, memory controller 122, and I/O interface 126 may be provided on-chip to facilitate long-latency access to general memory 124 and to various I/O hubs 128, respectively.

Symmetric multi-processor (SMP) fabric controls 118 is a special purpose device that mediates the contention for fabric bus 130 by the various attached devices, and provides for SMP topology configuration via expansion ports A, B, X, Y and Z 120. Five expansion ports are shown in the embodiment, however, it is understood that to achieve varying levels of complex multi-chip topologies, fewer or more expansion ports may be used. It is anticipated that five ports may provide 64 chips with rapid instruction, data and timing signals among them.

Pervasive controls 108 are circuits that exist both outside and mingled within the various processing blocks found on chip. Among the functions of pervasive controls 108 are providing of back-ups to the processor state on each processor core 102 by providing redundant copies of various GPRs and SPRs of each processor core 102 at convenient instruction boundaries of each processor core 102. In addition, pervasive controls 108 may assist in the detection of errors and communication of such errors to outside support processors (service processor) 110 for further action by, e.g., out-of-band firmware. It should be noted that the terms "support processor" and "service processor" may be used interchangeably.

Pervasive controls 108 are a gating point for redundant oscillators 112 and provide or receive derivative timing signals. It is appreciated that a fault or other condition may remove one or more redundant oscillators 112 from the configuration, and it is an object of pervasive controls 108 to select the better timing signal (or at least one that is within tolerances) from among redundant oscillators 112, and step-encoded signals that may arrive via expansion ports 120.

Pervasive controls 108 may also contain control state machines for starting and stopping clocks, scanning of Level Sensitive Scan Design (LSSD) latches, and serial communication paths (SCOM) to register facilities, in response to stimulus from support processors 110.

Figure 2:
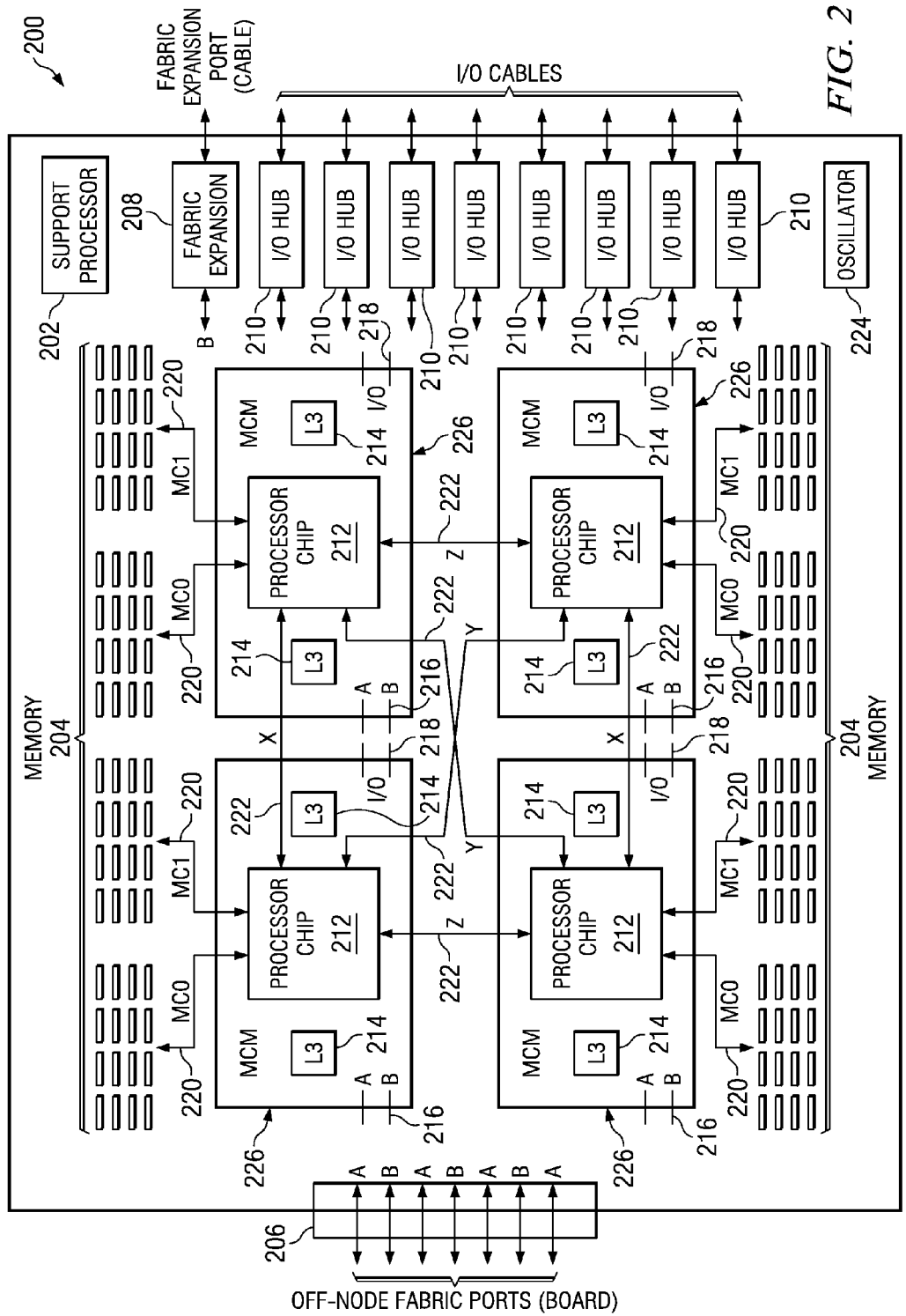
FIG. 2 is an exemplary configuration of a symmetric multiprocessor node in accordance with an illustrative embodiment.
Figure 3A:
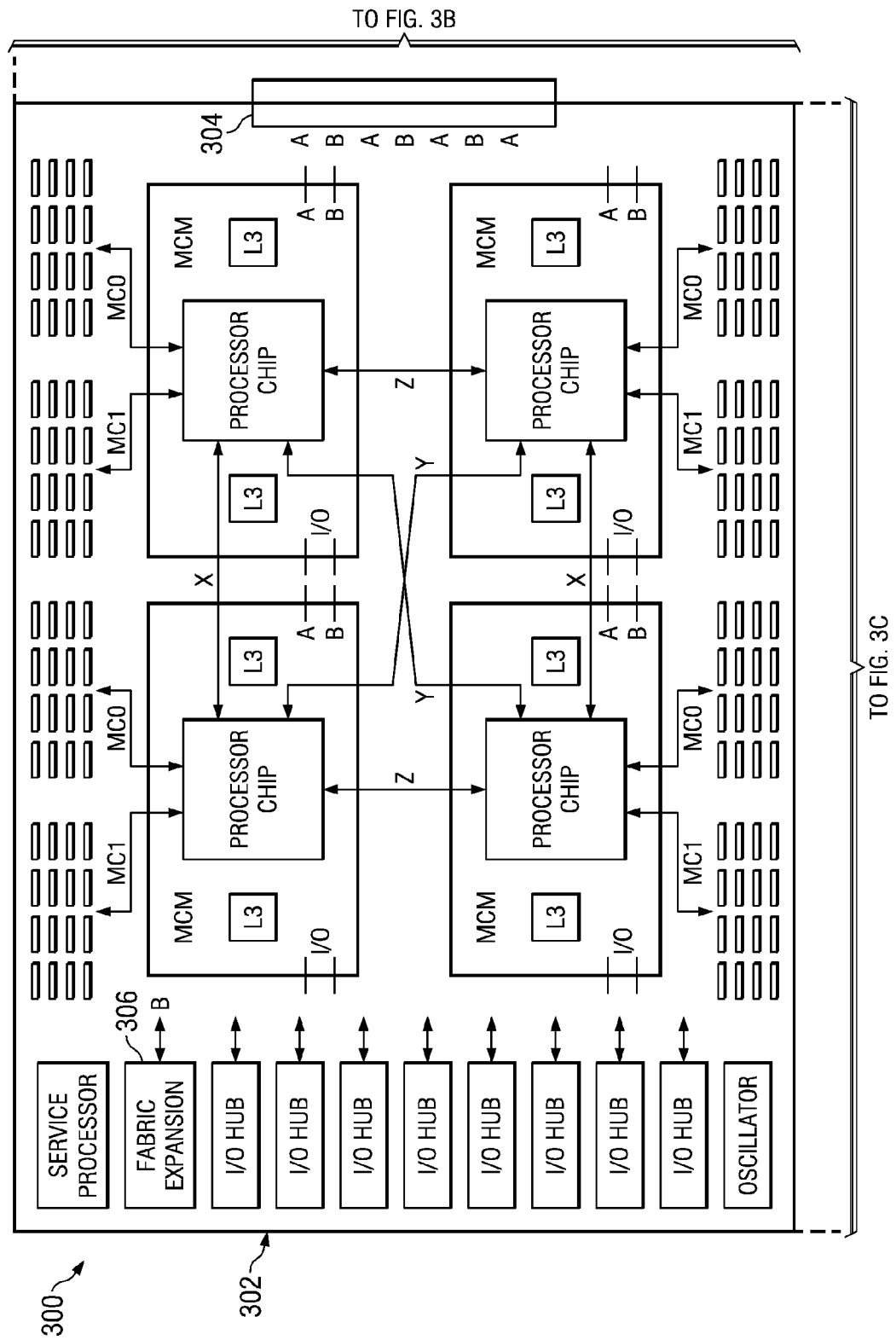
FIGS. 3A-3H represent an exemplary combination of a plurality of processor nodes in accordance with an illustrative embodiment.
Figure 3B:
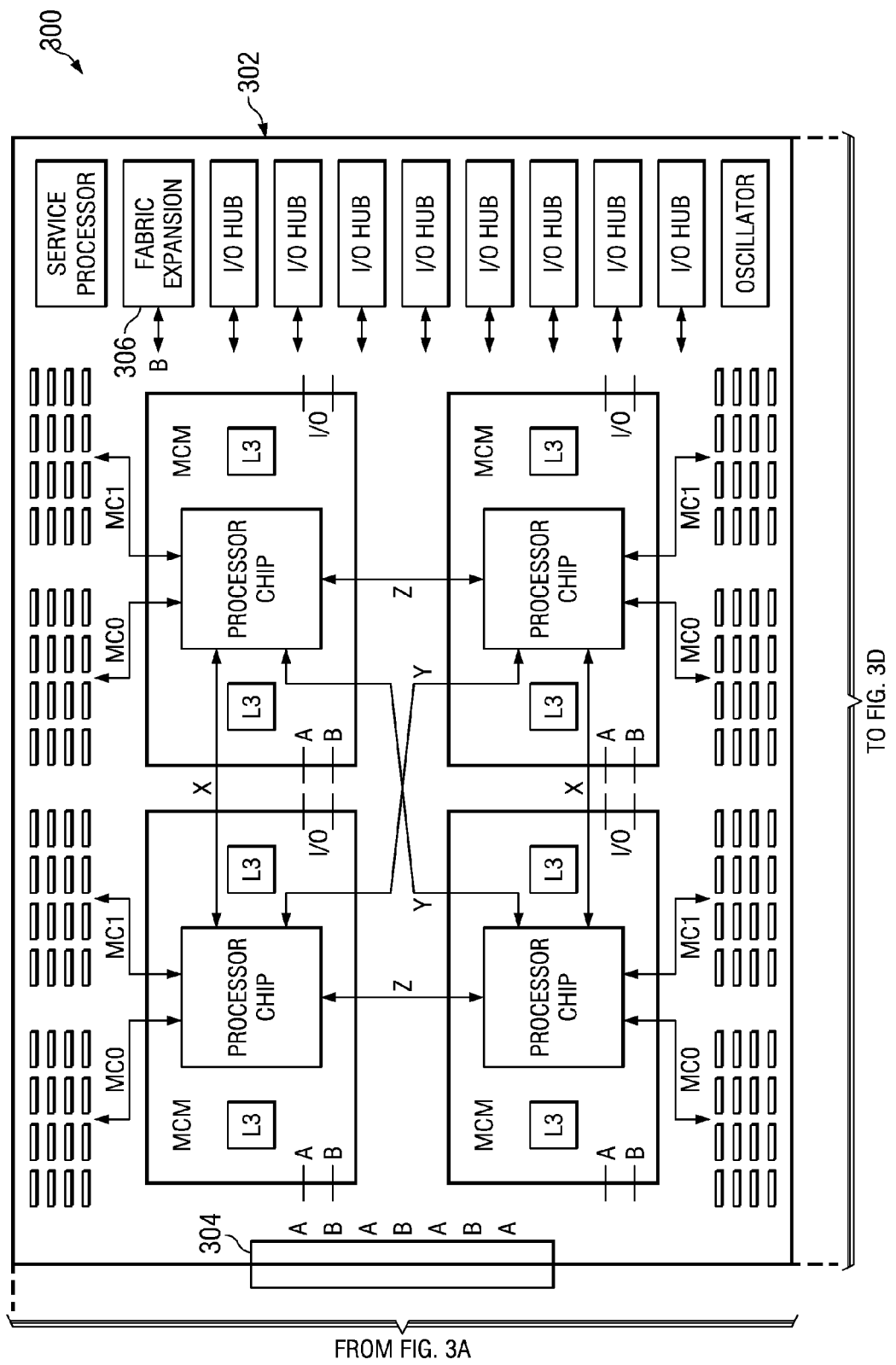
Figure 3C:
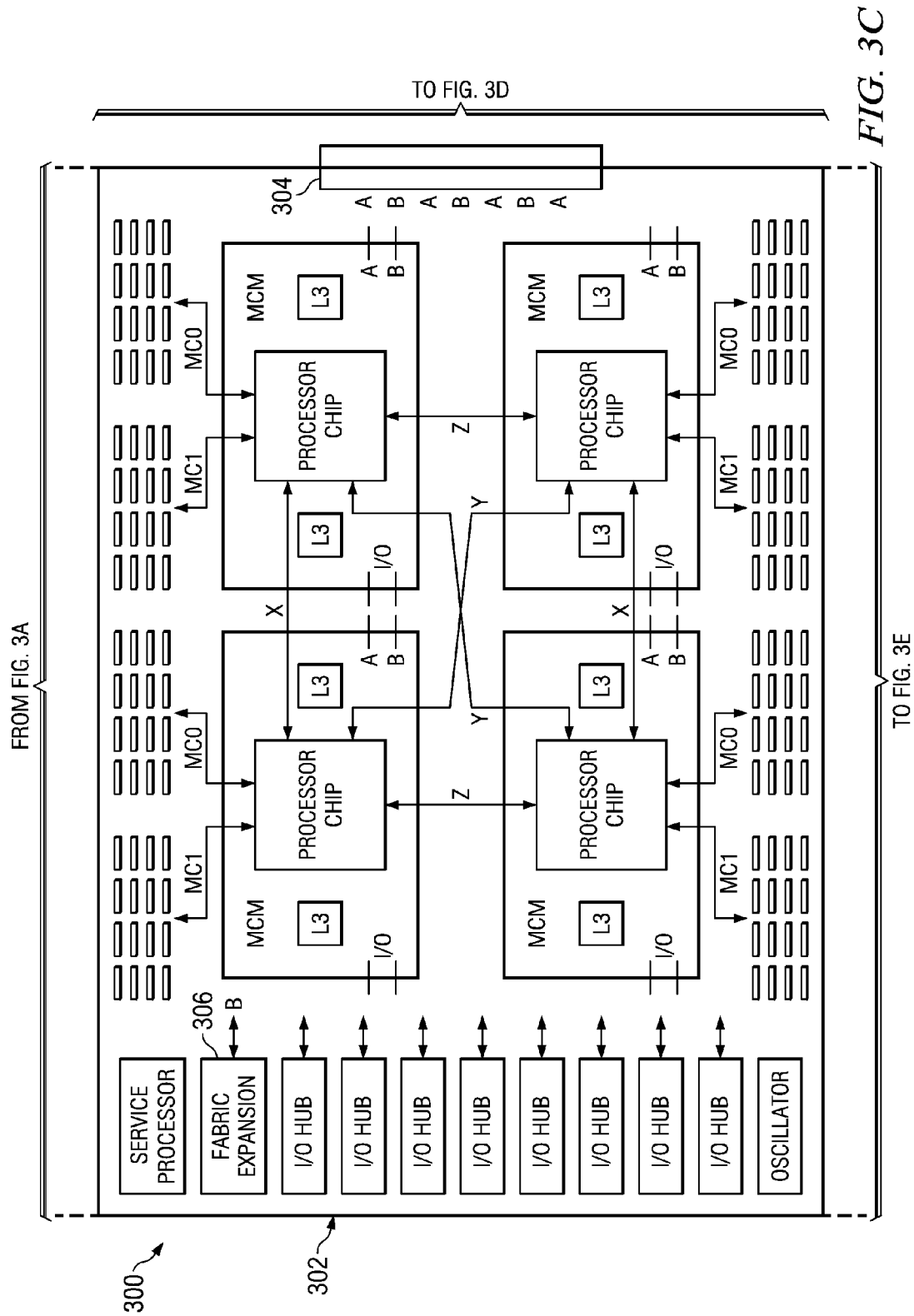
Figure 3D:
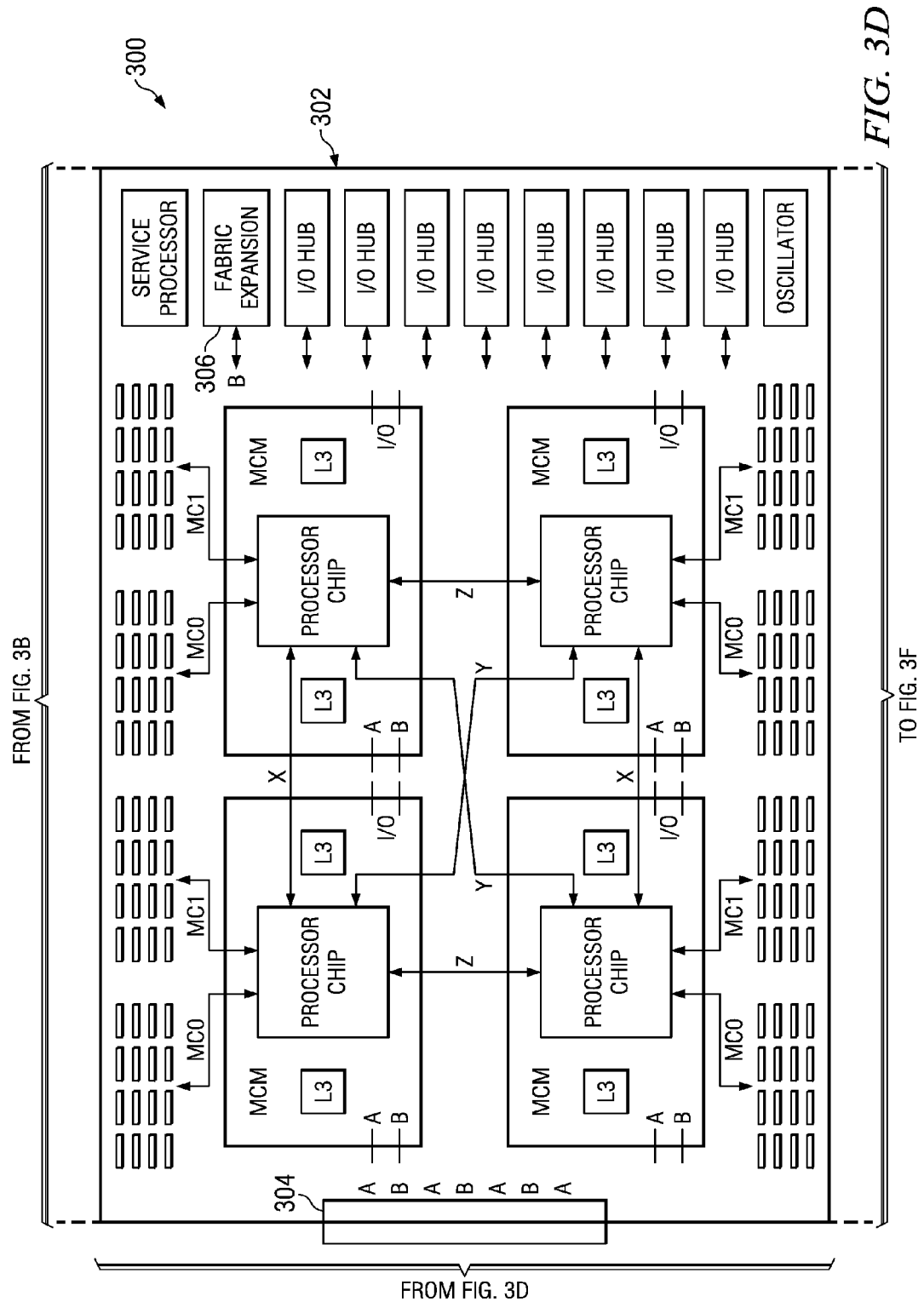
Figure 3E:
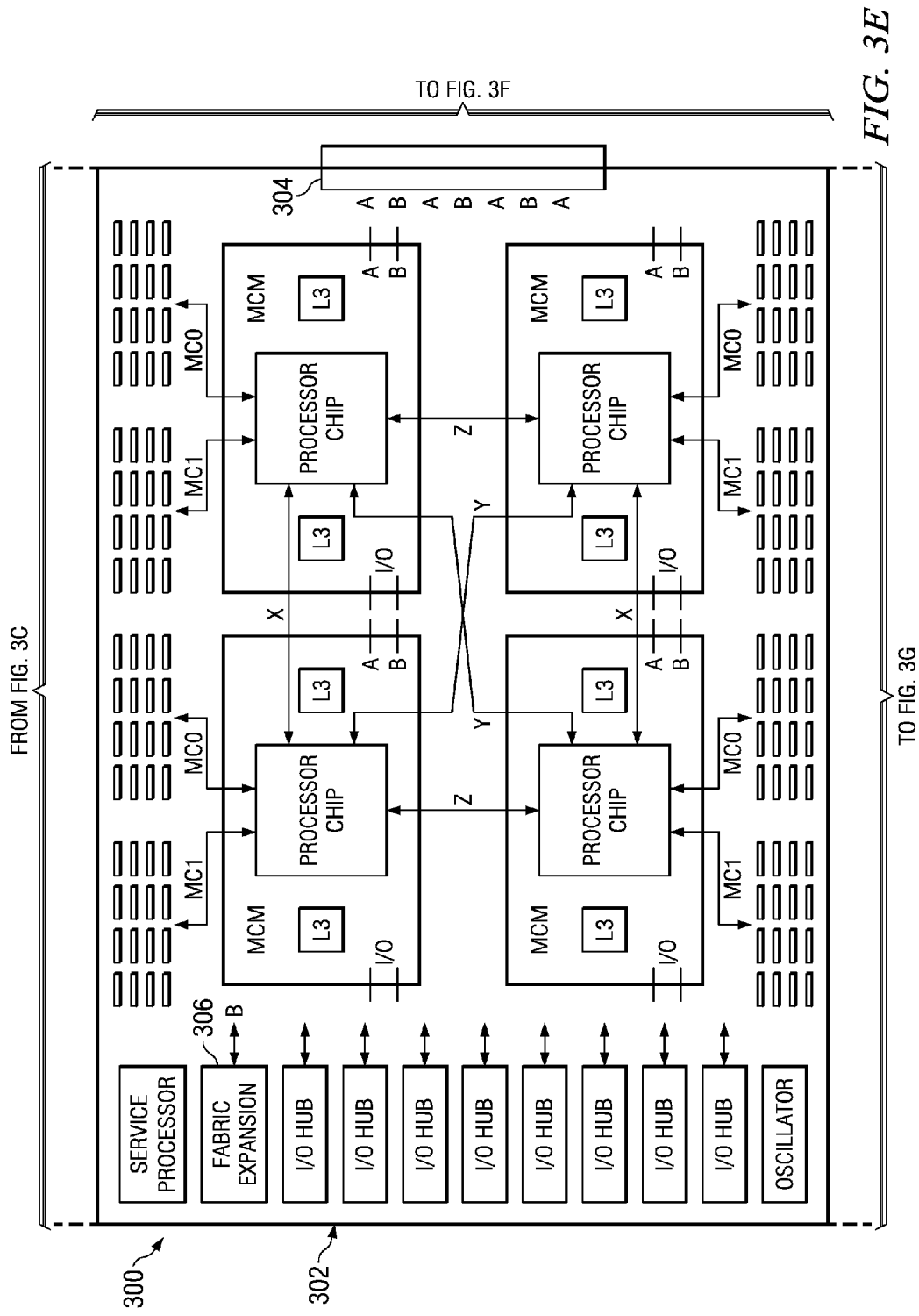
Figure 3F:
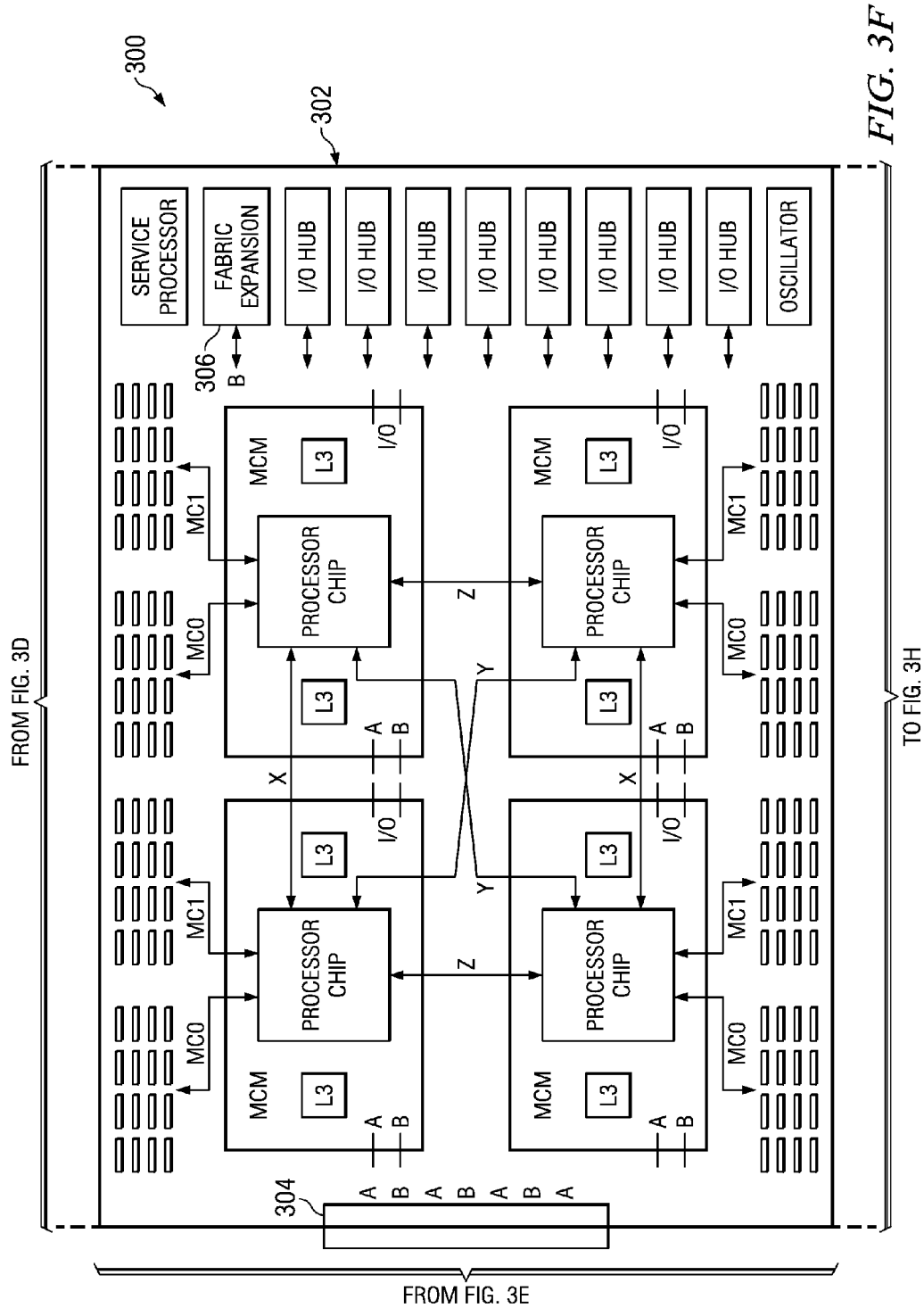
Figure 3G:
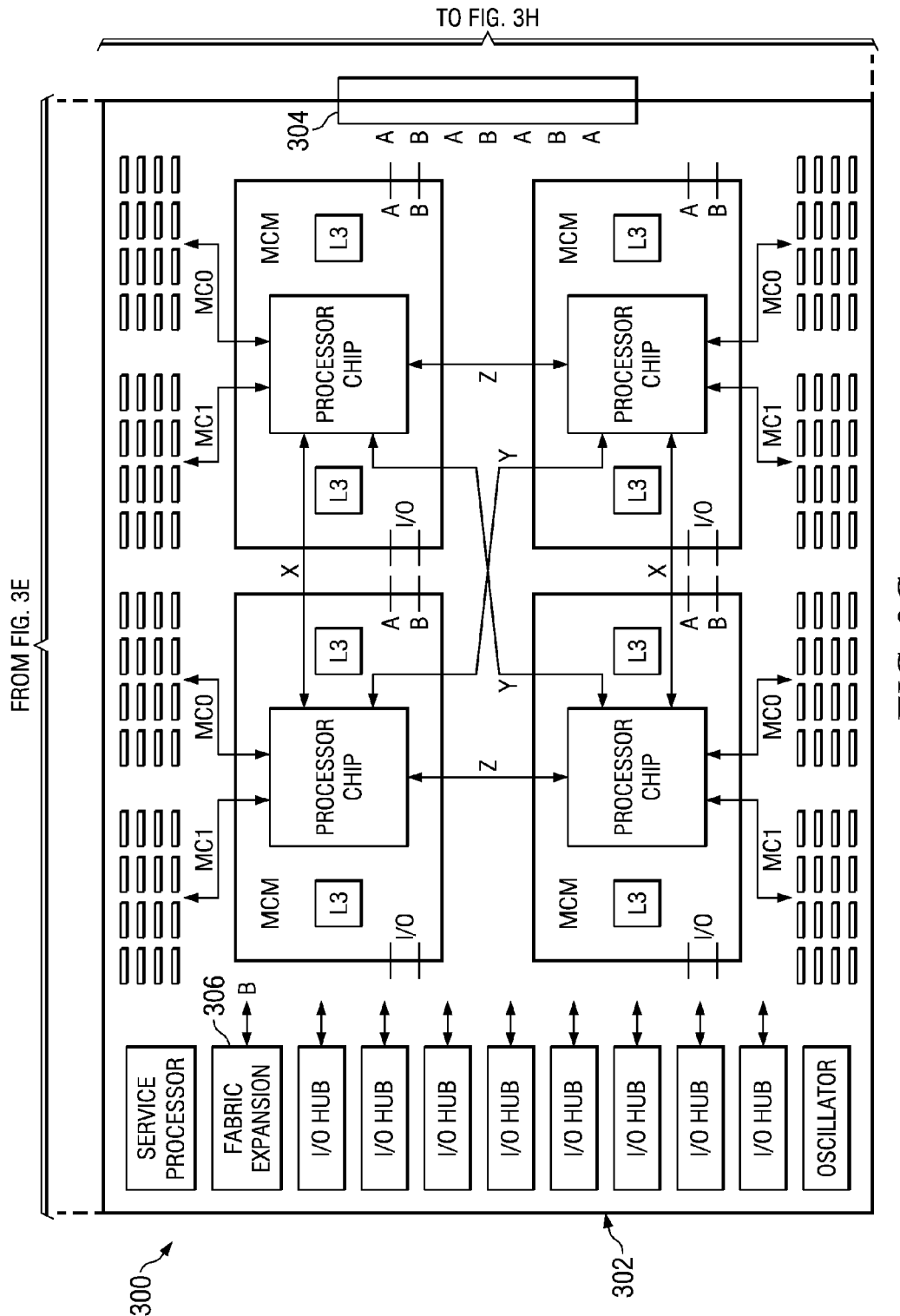
Figure 3H:
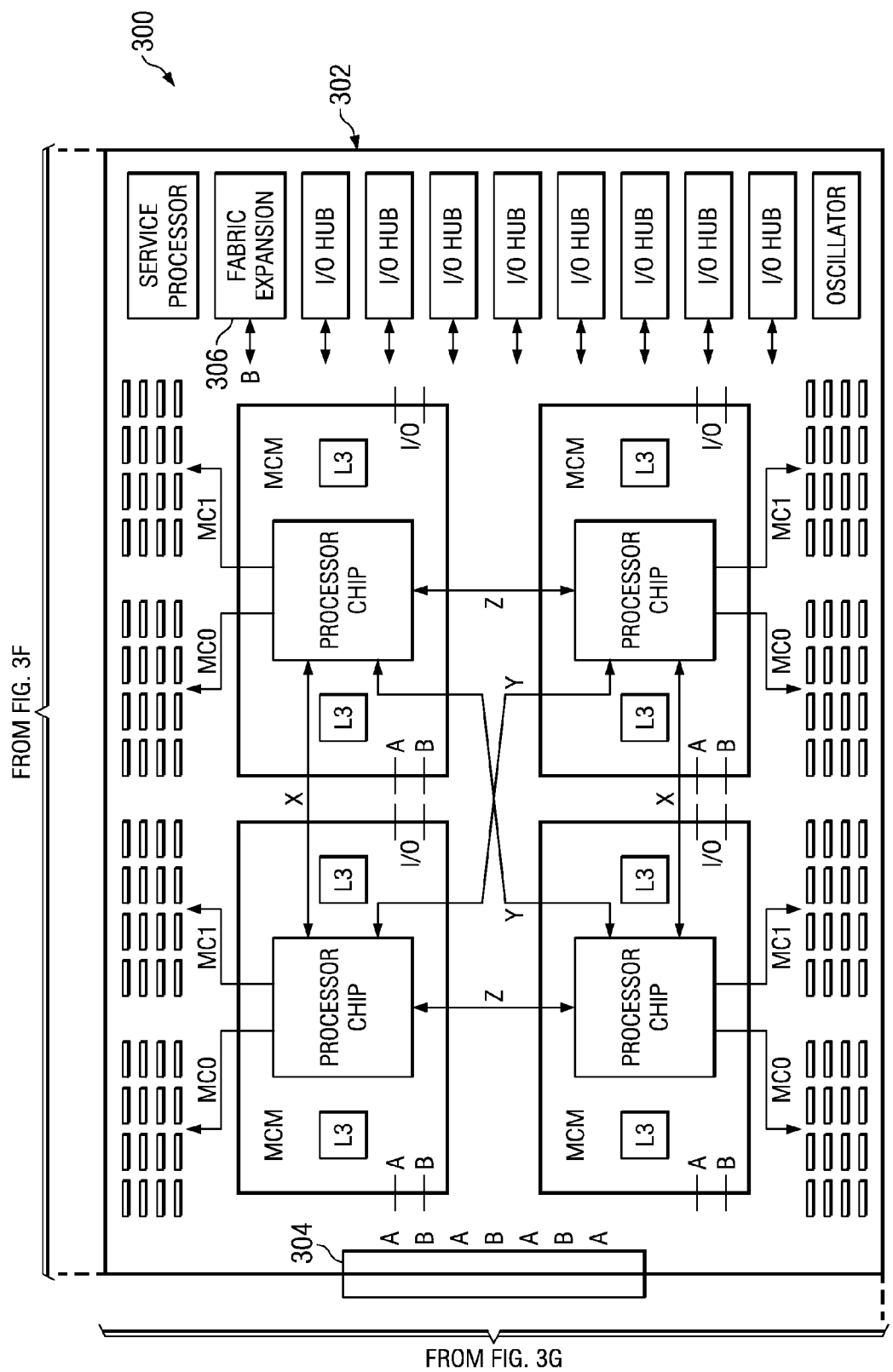

FIG. 2 depicts an exemplary configuration of a symmetric multiprocessor using the core processor chip of FIG. 1 in the form of processor node 200 and in accordance with an illustrative embodiment. Processor node 200 may contain one or more service processors 202, memory banks 204, I/O hubs 210, fabric expansion port 208 and off-node fabric expansion ports 206. Fabric expansion port 208 and off-node fabric expansion ports 206 provide connectivity for A and B ports 216 from each of multi-chip modules (MCM) 226 to MCMs on other processor nodes. Fabric ports X, Y, and Z 222 interconnect MCMs 226 within the same processor node 220. Fabric ports X, Y, Z, A, and B relate to fabric 130, SMP fabric controls 130, and expansion ports 120 from FIG. 1.

Additionally, memory banks 204 are connected to MCM 226 through connections 220 which relate to the connection between memory controller 122 and memory 124 of FIG. 1. Each multi-chip module 226 may be identical in its hardware configuration, but configured by firmware during system initialization to support varying system topologies and functions, e.g., enablement of master and slave functions or connectivity between various combinations of multiple nodes in a scaleable multi-node SMP system.

Within a particular MCM there may be found core processor chip 212, which may be a processor chip such as processor chip 100 of FIG. 1, as well as L3 cache 214, which may be a L3 cache such as L3 cache 116 of FIG. 1. Processor node 200 may have one or more oscillators 224 routed to each chip found on processor node 200. Connections between the oscillators and functional units extend throughout the board and chips, but are not shown in FIG. 2 in order to limit clutter. Similarly, it is understood that many convoluted interconnects exist between expansion ports 206, 208 and I/O hubs 210 to the various chips on the board, such as fabric ports 216 and I/O ports 218 of MCM 226, among other components, though such interconnects are not shown in FIG. 2.

In accordance with an illustrative embodiment, FIGS. 3A-3H depict a combination of a plurality of processor nodes, such as processor node 200 of FIG. 2. In this example, on the single board or plane 300, there exist eight processor nodes 302 that are connected through off-node fabric ports 304 of individual processor nodes 302. Off-node fabric expansion ports 304 allow the different processor nodes 302 to pass data and commands to other nodes on plane 300. Though not shown, additional planes similar to plane 300 may be interconnected through fabric expansion ports 306 of the various processor nodes 302.

Figure 4:
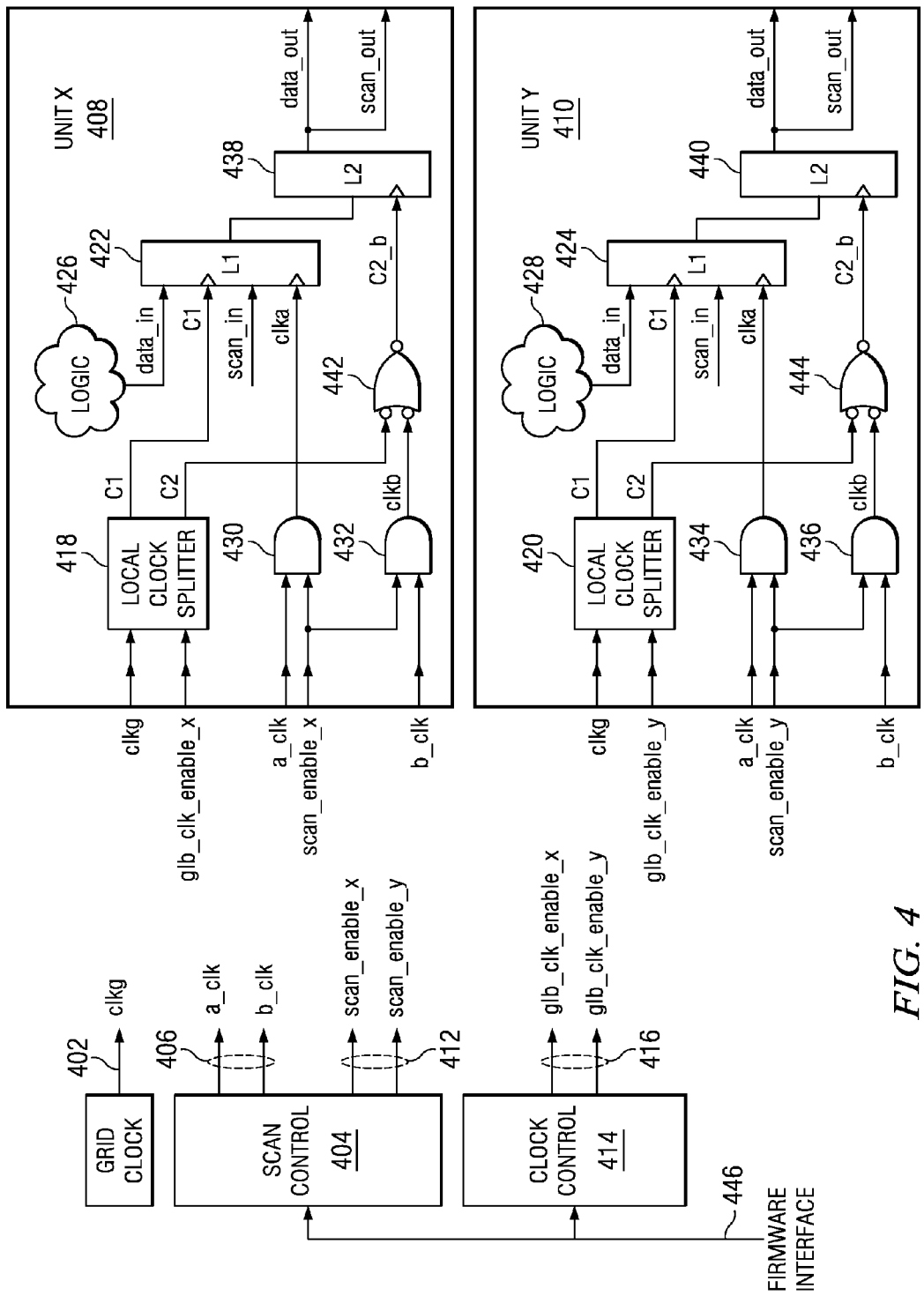
FIG. 4 illustrates the clocking and scanning of Level-Sensitive Scan Design (LSSD) latches in multiple functional domains in accordance with an illustrative embodiment.

FIG. 4 illustrates the clocking and scanning of Level-Sensitive Scan Design (LSSD) latches in multiple functional domains in accordance with an illustrative embodiment. Grid clock 402 is distributed across the entire chip, such as processor chip 212 of FIG. 2, using a grid structure for balanced electrical characteristics. Grid clock 402 may be driven from a phase-locked-loop (PLL) circuit or some other type of stable oscillator source, such as oscillator 224 of FIG. 2.

Scan control logic 404 provides global scan clocks a_clk and b_clk 406 which are distributed to all logic units on the chip. Logic unit x 408 and logic unit y 410 represent two such logic units. Scan control logic 404 also provides independent scan_enable signals 412 for logic unit x 408 and logic unit y 410, which determine whether the latches in each corresponding logic unit will be included in a scan operation or not.

Clock control logic 414 provides independent global clock enable signals 416 for each logic unit which control whether the logic clocks are running or stopped to each corresponding logic unit.

Logic unit x 408 and logic unit y 410 each contain at least one local clock splitter 418 or 420, respectively, which split grid clock 402 into separate opposite-phase C1 and C2 clocks. Level-sensitive scan design (LSSD) latches use master-slave flip-flops. Master L1 flip-flops 422 and 424 have a data input and a scan input. The data input is fed by functional logic 426 or 428 and captured with the C1 clock from local clock splitter 418 or 420. Global scan clocks a_clk and b_clk 406 are ANDed with the individual scan_enable signals 412 in AND gates 430, 432, 434, or 436 to form internal scan clocks clka and clkb. The internal scan clock clka is used to capture the scan input to master L1 flip-flops 422 and 424 which is fed by the scan output of a different latch (not shown in diagram). Slave L2 flip-flops 438 or 440 only get data from the output of master L1 flip-flops 422 or 424. The C2 output of local clock splitter 418 or 420 is ORed with the internal scan clock clkb in OR gates 442 or 444 to capture the data from master L1 flip-flops 422 or 424 into slave L2 flip-flops 438 or 440.

Scan control logic 404 is used to shift data serially through latches that are chained together scan_out to scan_in without modification of the values along the way. Clock control logic 414 is used to enable the updating of latches with the computational results each machine cycle. These operations are mutually exclusive within the same functional unit.

Scan control logic 404 and clock control logic 414 are driven from firmware interface 446. The implementation of firmware interface 446 is outside the scope of this application, but could be an industry standard interface such as I2C or JTAG (IEEE 1149.1), or as in the illustrative embodiments a proprietary Serial Communication (SCOM) interface which can be used by out-of-band firmware running on an external service processor 110 of FIG. 1, or host firmware running on one or more processor cores, such as processor core 102 of FIG. 1, in the system.

Figure 5A:
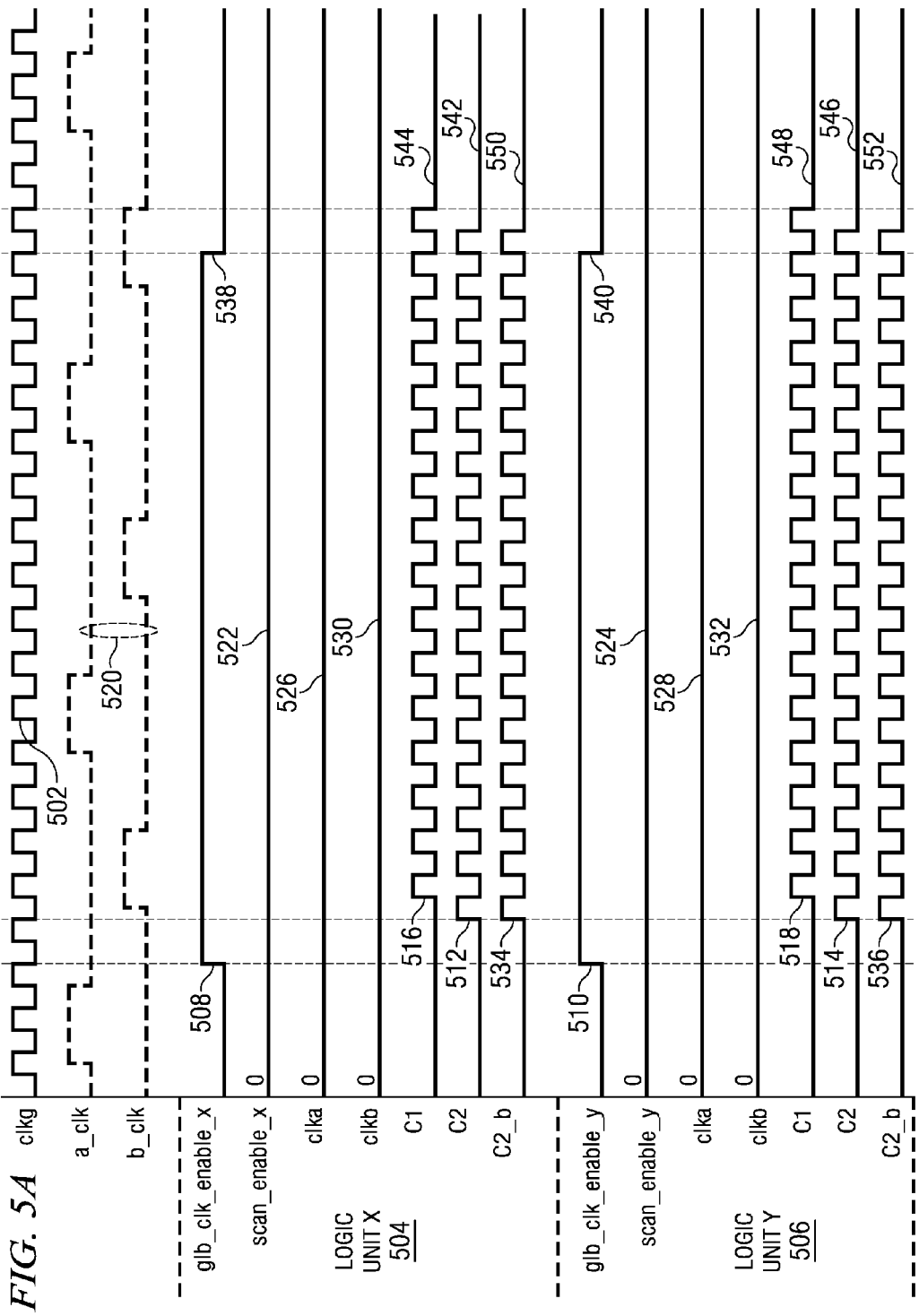
FIG. 5A depicts an exemplary timing diagram for functional clocking of multiple functional logical units in accordance with an illustrative embodiment.

FIG. 5A depicts an exemplary timing diagram for functional clocking of multiple functional logical units in accordance with an illustrative embodiment. The logical units may be logical units, such as logical unit 408 and logical unit 410 of FIG. 4. Grid clock (clkg) 502 is free running from early in the machine boot sequence. Firmware issues a command to clock control logic, such as clock control logic 414 of FIG. 4, to start the clocks for both logic unit x 504 and logic unit y 506 at the same time. The global clock enable signals, glb_clk_ enable_x 508 and glb_clk_enable_y 510, go active, which allows the local clock splitters, such as local clock splitters 418 and 420 of FIG. 4, to activate their clock outputs. As illustrated, C2 clocks 512 and 514 activate out-of-phase with clkg 502 whereas C1 clocks 516 and 518 activate in-phase with clkg 502. Global scan clocks a_clk/b_clk 520 may or may not be active, depending on whether a scan operation is being performed to some other functional unit on the chip. However, regardless of whether global scan clocks a_clk/b_clk 520 are running, the functional unit scan_enable signals, scan_enable_x 522 and scan_enable_y 524, are inactive low, so local scan clocks clka 526 and 528 and local scan clocks clkb 530 and 532 are inactive. Since the local scan clocks clkb 530 and 532 are inactive, C2_b clocks 534 and 536 simply follow the C2 clocks 512 and 514 from the output of the local clock splitter. C1 clocks 516 and 518 and C2_b clocks 534 and 536 must be inverse phases, since if C1 clocks 516 and 518 and C2_b clocks 534 and 536 are both active at the same time the data_in from functional logic, such as functional logic 426 or 428 of FIG. 4, would flush through the master L1 flip-flops, such as master L1 flip-flops 422 or 424 of FIG. 4, and slave L2 flip-flops, such as slave L2 flip-flops 438 or 440 of FIG. 4, causing the latch to behave only as a delay element rather than a memory element.

Returning to FIG. 5A, firmware then issues a command to the clock control logic, such as clock control logic 414 of FIG. 4, to stop the clocks for both logic unit x 504 and logic unit y 506 at the same time. glb_clk_enable_x 538 and glb_clk_enable_y 540 signals go inactive, which causes the local clock splitters to deactivate their outputs 542, 544, 546, and 548 as illustrated. Again, C2_b clocks 534 and 536 simply follow C2 clocks 512 and 514 output of the splitter, so C2_b 550 and C2_b 552 also stop.

Figure 5B:
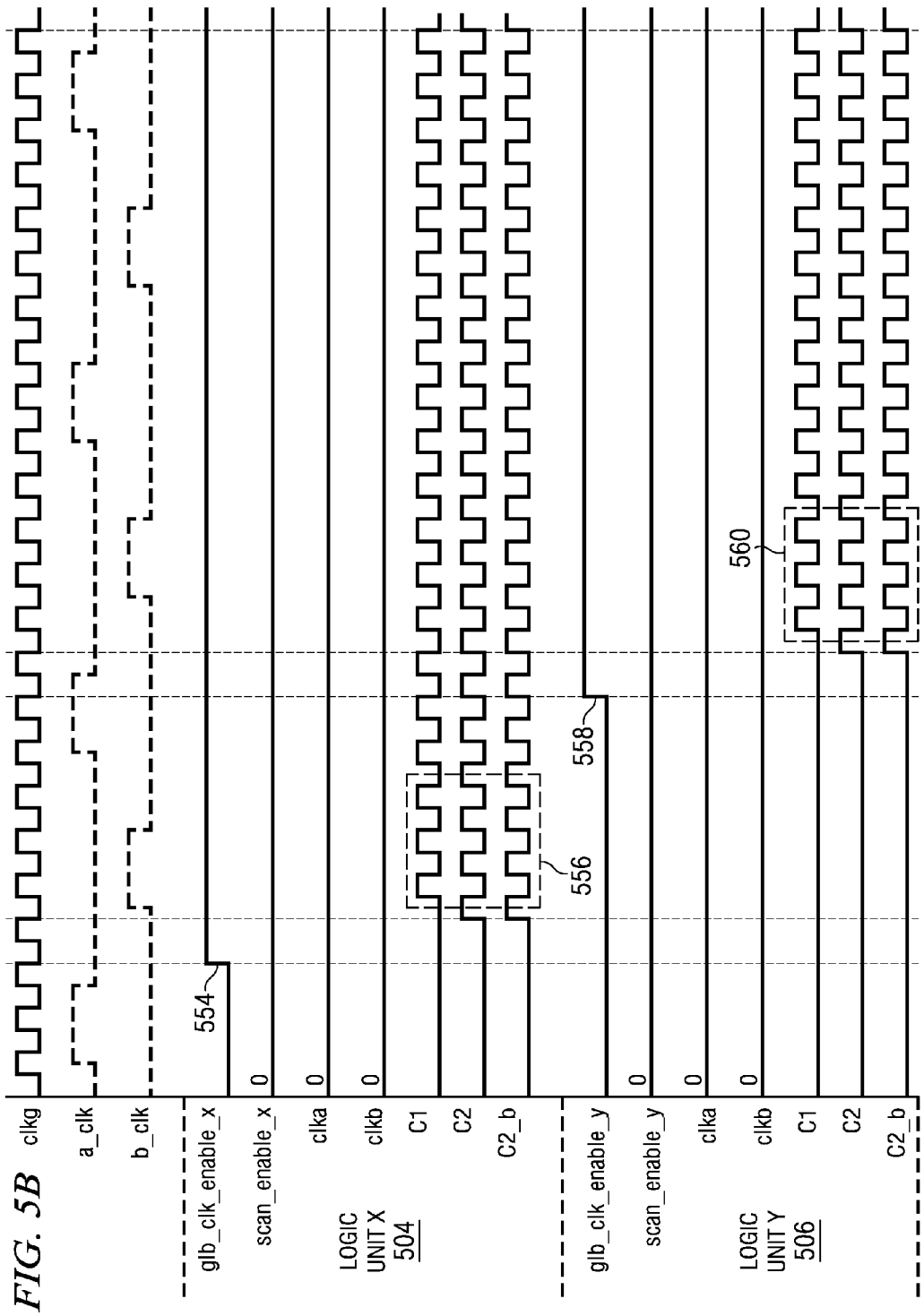
FIG. 5B illustrates that the global clock enable signals from clock control logic may be controlled independently in accordance with an illustrative embodiment.

FIG. 5B illustrates that the global clock enable signals from clock control logic may be controlled independently in accordance with an illustrative embodiment. The global clock enable signals may be global clock enable signals such as global clock enable signals 416 of FIG. 4, and the clock control logic may be clock control logic, such as clock control logic 414 of FIG. 4. Firmware issues a command to the clock control logic to start the clocks to only logic unit x 504. Clock control logic activates glb_clk_enable_x 554 which starts functional clocks 556 for only logic unit x 504. Firmware then issues a separate command to the clock control logic to start the clocks to logic unit y 506 while leaving the clocks running to logic unit x 504. Clock control logic activates glb_clk_enable_y 558 which starts functional clocks 560 for logic unit y 506.

Figure 6:
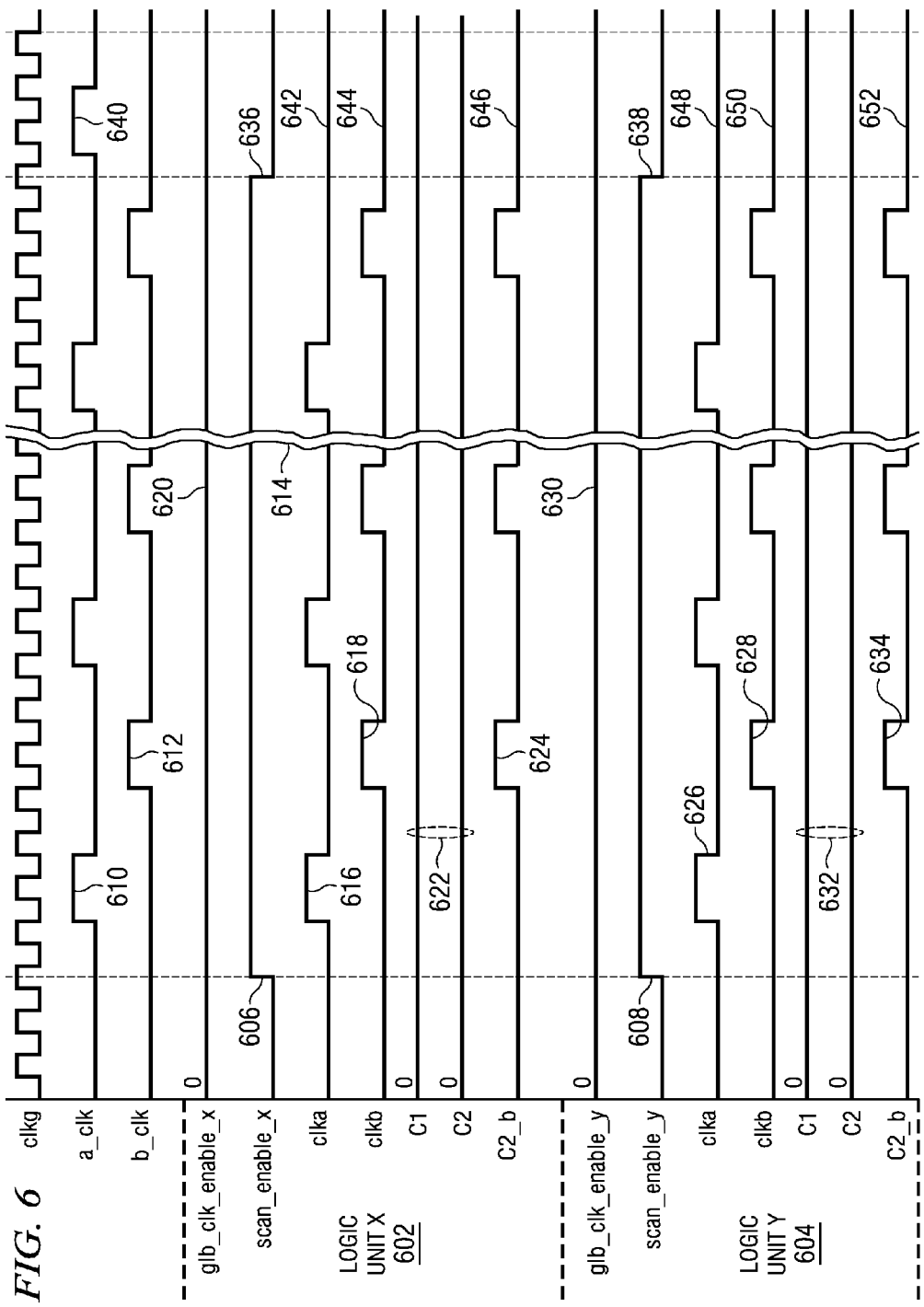
FIG. 6 is a timing diagram of the scan clocking to multiple functional logic units in accordance with an illustrative embodiment.

FIG. 6 is a timing diagram of the scan clocking to multiple functional logic units in accordance with an illustrative embodiment. The logical units may be logical units, such as logical unit 408 and logical unit 410 of FIG. 4. Firmware issues a command to scan control logic, such as scan control logic 404 of FIG. 4, to select both logical unit x 602 and logical unit y 604 for scanning. Scan control logic activates the global scan_enable signals, scan_enable_x 606 and scan_enable_y 608. Scan control logic then activates global scan clocks a_clk 610 and b_clk 612 to serially shift the values through the latches scan chain. Firmware includes the number of latches in the scan chain with the scan command so that scan control logic can supply the correct number of a_clk 610 and b_clk 612 pairs for the number of bits to be shifted through the chain. Gap 614 in the timing diagram illustrates that the illustrated repetitive pattern may continue for longer than is actually shown on the figure.

The global scan clocks are ANDed using AND gates, such as AND gates 430, 432, 434, and 436 of FIG. 4, with the scan_enable in each functional logical unit 602 or 604. For logical unit x 602, since scan_enable_x 606 is active, local scan clock clka 616 follows global scan clock a_clk 610, and local scan clock clkb 618 follows global scan clock b_clk 612. Because glb_clk_enable_x 620 is inactive, C1 and C2 clocks 622 from the local clock splitter, such as local clock splitter 418 of FIG. 4, are inactive, so C2_b clock 624 follows local scan clock clkb 618. Similarly for logical unit y 604, since scan_enable_y 608 is active, local scan clock clka 626 follows global scan clock a_clk 610, and local scan clock clkb 628 follows global scan clock b_clk 612. Because glb_clk_enable_y 630 is inactive, C1 and C2 clocks 632 from the local clock splitter, such as local clock splitter 420 of FIG. 4, are inactive, so C2_b clock 634 follows local scan clock clkb 628.

After shifting the desired number of positions in the scan chain, firmware sends a command to the scan control logic to terminate the scan operation. The scan control logic deactivates both scan_enable_x 636 and scan_enable_y 638. In an exemplary embodiment, the scan control logic stops driving global scan clocks a_clk 610 and b_clk 612 after the scan operation ends, it would not matter if global scan clocks a_clk 640 remained running since, for logic unit x 602, scan_enable_x 636 being inactive will always force off the local scan clocks for logic unit x's 602 clka 642 and clkb 644, with C2_b clock 646 following clkb 644. Similarly for logic unit y 604, scan_enable_y 638 being inactive will force off the local scan clocks for logic unit y's 604 clka 648 and clkb 650, with C2_b clock 652 following clkb 650.

Figure 7:
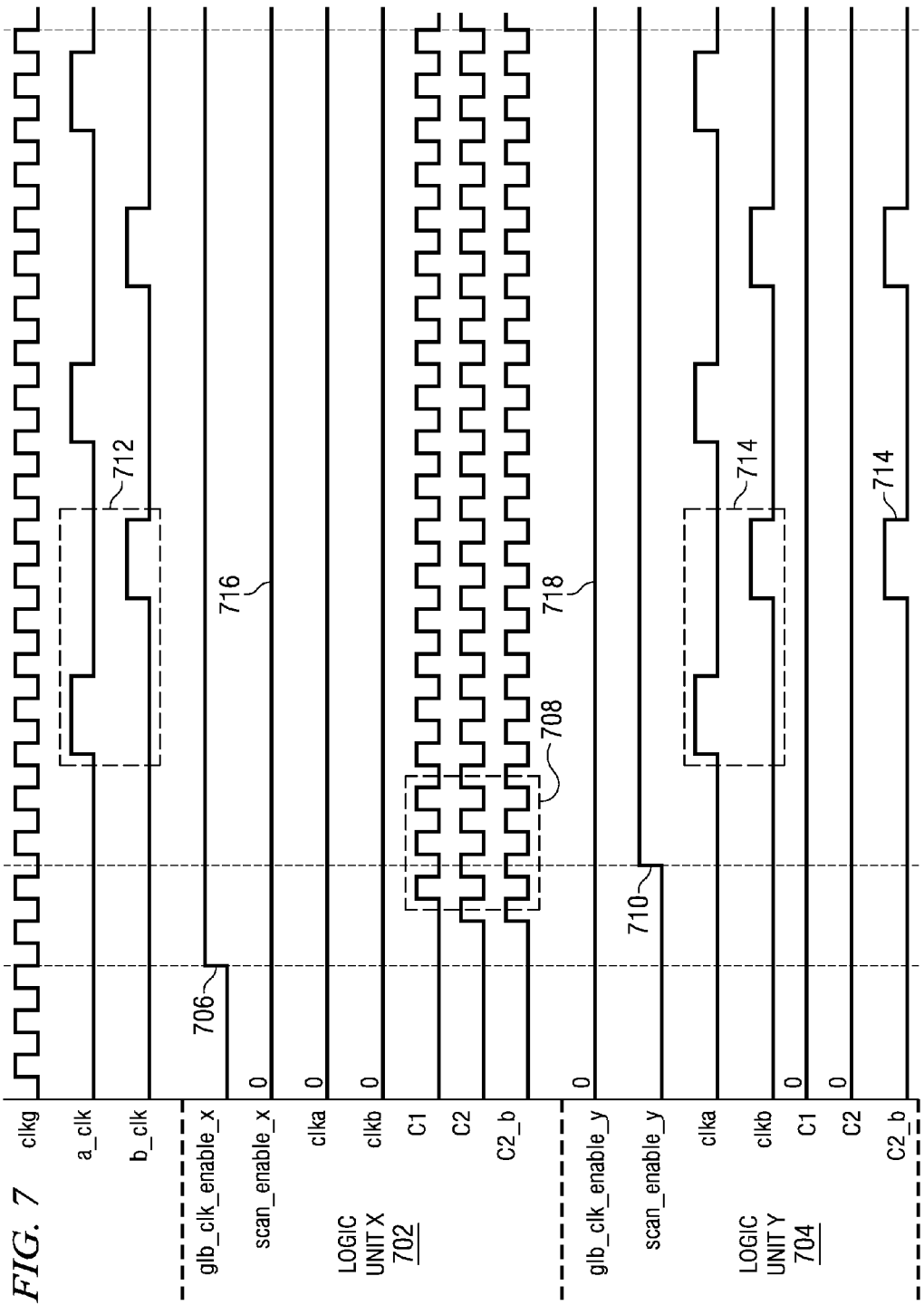
FIG. 7 illustrates the independent control of logic clocks and scan clocks for separate logic units in accordance with an illustrative embodiment.

FIG. 7 illustrates the independent control of logic clocks and scan clocks for separate logic units in accordance with an illustrative embodiment. Firmware sends a command to the clock control logic, such as clock control logic 414 of FIG. 4, to start the clocks to only logic unit x 702. The clock control logic activates glb_clk_enable_x 706 which activates clocks 708 within logic unit x 702. Firmware then sends a command to the scan control logic, such as scan control logic 404 of FIG. 4, to initiate a scan operation only to logic unit y 704. The scan control logic activates scan_enable_y 710 and drives global scan clocks 712 which pass through to local scan clocks 714. Since scan_enable_x 716 is inactive in logic unit x 702, logic unit x 702 is not affected by the active scan operation in logic unit y 704. Since glb_clk_enable_y 718 is inactive in logic unit y 704, logic unit y 704 is not affected by the logic clocks running in logic unit x 702.

It should be obvious to those skilled in the art that if logic clocks are inadvertently stopped to a logic unit then it will cause that logic unit to fail. Somewhat less obvious are the hazards illustrated in FIG. 8 which are created by inadvertently attempting to scan a logic unit while the logic clocks are still running to that unit. Such a condition could be induced due to firmware bugs causing incorrect commands to be sent to scan control logic or clock control logic.

Figure 8:
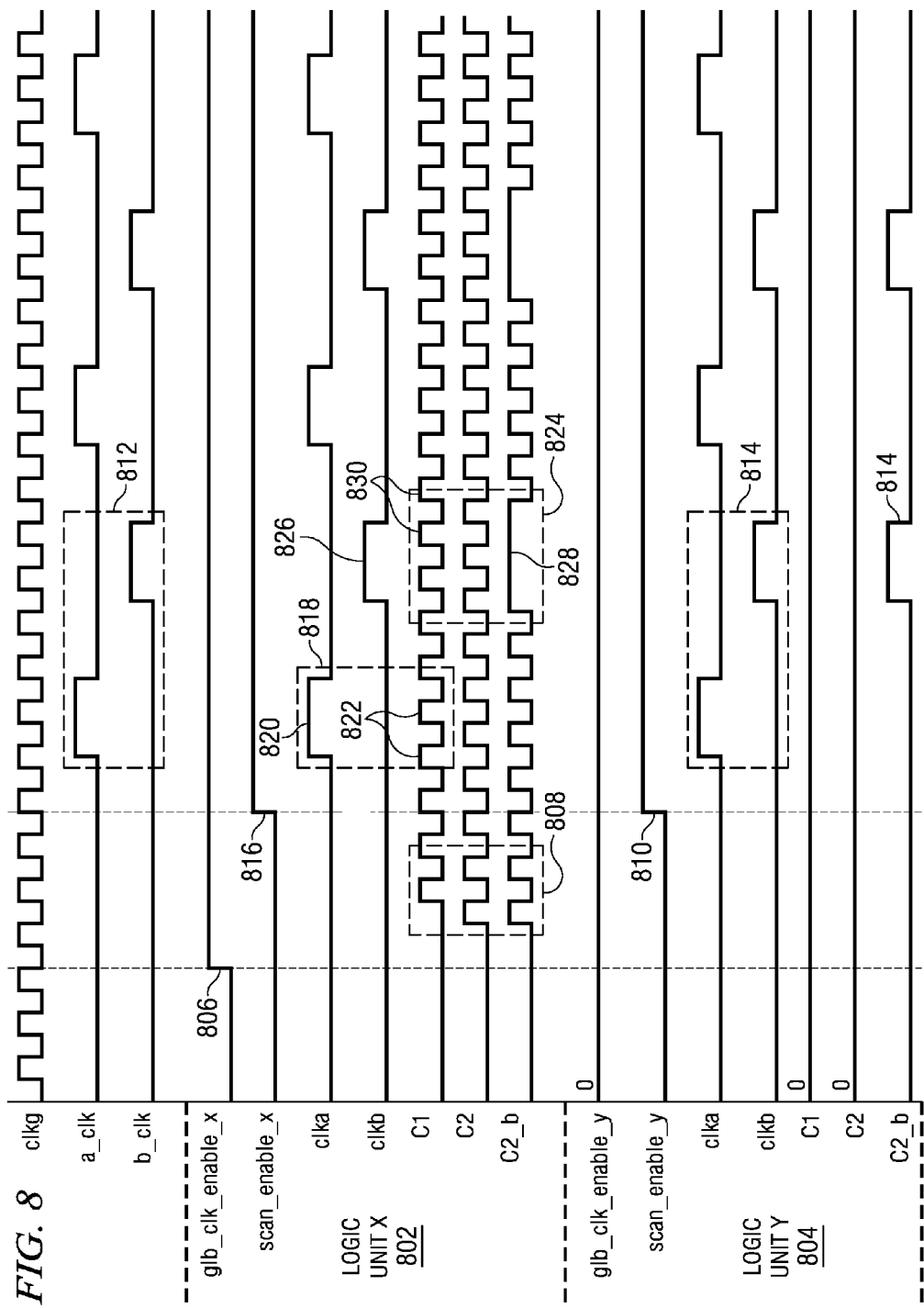
FIG. 8 illustrates hazards that are inadvertently created while attempting to scan a logic unit while the logic clocks are still running to that unit in accordance with an illustrative embodiment.

FIG. 8 illustrates hazards that are inadvertently created while attempting to scan a logic unit while the logic clocks are still running to that unit in accordance with an illustrative embodiment. Firmware first sends a command to the clock control logic, such as clock control logic 414 of FIG. 4, to start the clocks to only logic unit x 802. The clock control logic activates glb_clk_enable_x 806 which activates clocks 808 within logic unit x 802. Firmware then sends a command to the scan control logic, such as scan control logic 404 of FIG.

4, to initiate a scan operation to logic unit y 804, but incorrectly also includes logic unit x 802. The scan control logic activates scan_enable_y 810 and drives global scan clocks 812 which pass through to local scan clocks 814 for logical unit y 804. However, because the firmware bug also included logic unit x 802 in the target of the scan operation, the scan control logic also activates scan_enable_x 816 in logic unit x 802. This creates two hazards within logic unit x 802.

First hazard 818 shows local scan clock clka 820 active at the same time as C1 clock 822 output from the local clock splitter. As mentioned earlier, having both C1 clock 822 and local scan clock clka 820 active at the same time to the master L1 flip-flop causes an unpredictable value to be captured in the latch.

Second hazard 824 shows local scan clock clkb 826 ORed into C2_b clock 828, which causes C2_b clock 828 to be active at the same time as C1 clock 830 output from the local clock splitter. As noted earlier, if C1 clock 830 and C2_b clock 828 are active at the same time, the master L1 flip-flop and slave L2 flip-flop will flush and propagate an unpredictable value to downstream logic.

Figure 9:
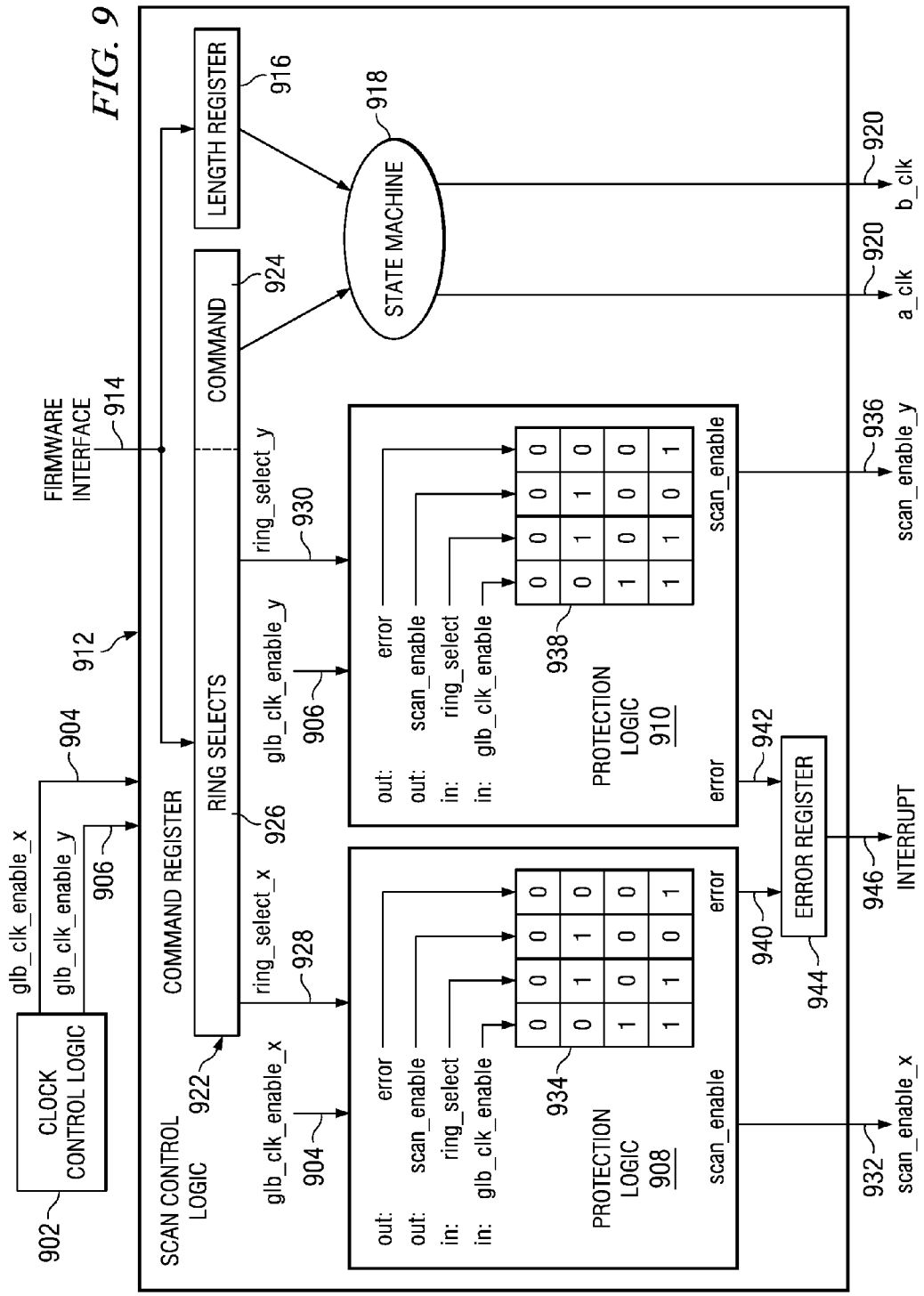
FIG. 9 illustrates clock-running scan protection for multiple functional units in accordance with an illustrative embodiment.

FIG. 9 illustrates clock-running scan protection for multiple functional units in accordance with an illustrative embodiment. Clock control logic 902, such as clock control logic 414 of FIG. 4, provides global clock enables, glb_clk_enable_x 904 and glb_clk_enable_y 906, to all functional units and to protection logic 908 and 910, which is part of scan control logic 912, such as scan control logic 404 of FIG. 4. Firmware interface 914, such as firmware interface 446 of FIG. 4, initiates a scan operation by first writing length register 916 in scan control logic 912, which state machine 918 uses to produce the correct number of global scan clocks 920. Then firmware interface 914 writes command register 922 that contains command field 924 to identify the type of scan operation, such as a read, write, start, continue, or end, to state machine 918 and ring selects 926, which identify which scan chains will be operated on by the scan operation.

Ring selects field 926 could have a dedicated bit for each scan chain, or could use encoded values or combinations of bits to select numerous combinations of scan chains. For clarity of the example, FIG. 9 shows only two separate ring selects 928 and 930 corresponding to functional logic unit x and functional logic unit y, such as logical units 408 and 410 of FIG. 4.

Protection logic 908 uses the global clock enable for functional unit x, glb_clk_enable_x 904, and the ring select for functional unit x, ring_select_x 928, to determine whether it should activate the scan_enable for functional unit x, scan_enable_x 932, according to truth table 934. Similarly, protection logic 910 uses the global clock enable for functional unit y, glb_clk_enable_y 906, and the ring select for functional unit y, ring_select_y 930, to determine whether it should activate the scan_enable for functional unit y, scan_enable_y 936, according to truth table 938.

Protection logic truth table 934 is for functional unit x and illustrates that if the input of ring_select_x 928 is zero then the output of scan_enable_x 932 will be zero regardless of the value of the input of glb_clk_enable_x 904. However, if the input of ring_select_x 928 is one then the output to scan_enable_x 932 will only be activated, set to one, if the input of glb_clk_enable_x 904 is zero which indicates that the logic clocks are not running to functional unit x. If the input of ring_select_x 928 is one and the input of glb_clk_enable_x 904 is also one, indicating the logic clocks to functional unit x are running, the output to scan_enable_x 932 is suppressed, set to zero, and error 940 is signaled to error register 944.

Similarly, protection logic truth table 938 is for functional unit y and illustrates that if the input of ring_select_y 930 is zero then the output of scan_enable_y 936 will be zero regardless of the value of the input of glb_clk_enable_y 906. However, if the input of ring_select_y 930 is one then the output to scan_enable_y 936 will only be activated, set to one, if the input of glb_clk_enable_y 906 is zero which indicates that the logic clocks are not running to functional unit y. If the input of ring_select_y 930 is one and the input of glb_clk_enable_y 906 is also one, indicating the logic clocks to functional unit y are running, the output to scan_enable_y 936 is suppressed, set to zero, and error 942 is signaled to error register 944.

For the error cases, state machine 918 may or may not continue to activate the specified number of global scan clocks 920. Either way, global scan clocks 920 have no effect because scan_enables 932 and 936 are not active, set to zero, so hazards, such as hazards 814 and 820 of FIG. 8, are avoided and further failures prevented.

Bits set in error register 944 cause interrupt 946 to be presented to the firmware. When the firmware is finished with the attempted scan operation, it will be notified via interrupt 946 and error register 944 that the scan operation was aborted because the logic clocks were running to the functional unit associated with the specified ring select. This indicates a likely firmware bug which incorrectly attempted a scan operation. Possible follow-on firmware diagnostics are outside the scope of this application.

Figure 10:
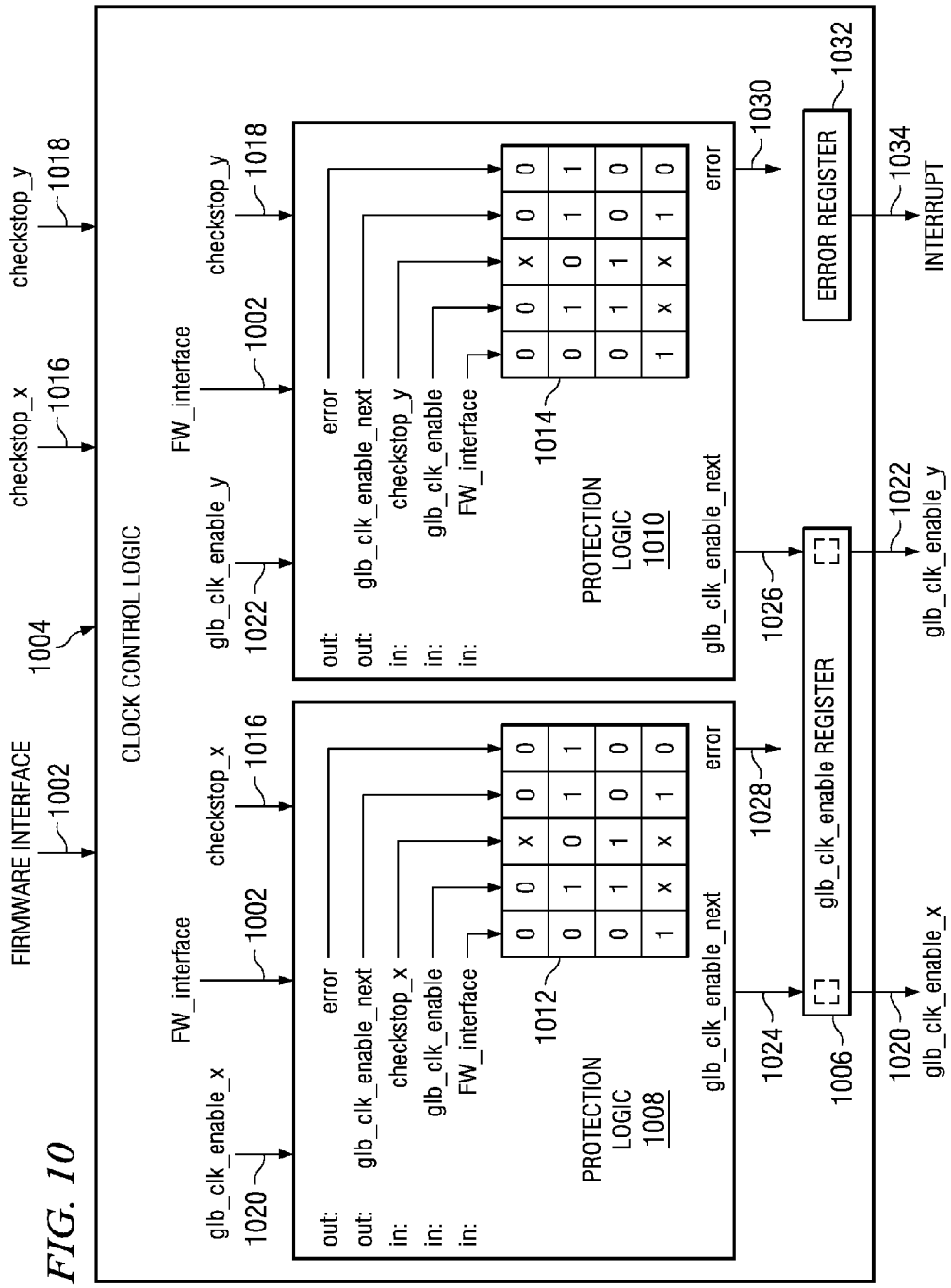
FIG. 10 illustrates checkstop clock-stop protection for multiple functional units in accordance with an illustrative embodiment.

FIG. 10 illustrates checkstop clock-stop protection for multiple functional units in accordance with an illustrative embodiment. Firmware interface 1002 sends a command to clock control logic 1004, such as clock control logic 406 of FIG. 4, to start or stop the clocks to one or more logical units by writing to global clock enable (glb_clk_enable) register 1006. Each bit in glb_clk_enable register 1006 drives the global clock enables to a corresponding functional unit. A one in the register bit activates the global clock enable to the corresponding functional unit so that the logic clocks are running, whereas a zero in the register bit deactivates the global clock enable to the corresponding functional unit so that the logic clocks are stopped. Protection logic 1008 and 1010 determine whether the values from firmware interface 1002 will be written to glb_clk_enable register 1006 or not according to truth tables 1012 and 1014. The glb_clk_enable register 1006 may have many bits corresponding to numerous separate functional units. For clarity of the illustrative embodiment, FIG. 10 shows protection logic 1008 and 1010 for only two separate bits corresponding to functional unit x and functional unit y, such as logical units 408 and 410 of FIG. 4.

Each functional unit indicates a fatal error condition as checkstop from checkstop_x 1016 or checkstop_y 1018 to the corresponding protection logic 1008 or 1010. The fatal error conditions are also reported to firmware (not shown) so that firmware knows to gather First Failure Data Capture (FFDC) for the error condition, which requires stopping the clocks to only the failed functional unit and reading the scan chains.

According to truth table 1012, if the current value of glb_clk_enable_x 1020 is one, indicating logic clocks are already running to the functional unit x, then a command from firmware interface 1002 to change glb_clk_enable_next 1024 input to glb_clk_enable register 1006 to zero to stop the clocks to functional unit x is only allowed if there is also a checkstop from checkstop_x 1016 indicated from functional unit x. Similarly, according to truth table 1014, if the current value of glb_clk_enable_y 1022 is one, indicating logic clocks are already running to the functional unit y, then a command from firmware interface 1002 to change glb_clk_enable_next 1026 input to glb_clk_enable register 1006 to zero to stop the clocks to functional unit y is only allowed if there is also a checkstop indicated from checkstop_y 1018 indicated from the functional unit y. In other words, protection logic 1008 and 1010 will only allow firmware to stop the clocks to a functional unit if that functional unit is already indicating a catastrophic checkstop error 1028 or 1030. This protects against a firmware bug incorrectly stopping the logic clocks to a running, healthy functional logic unit, which would cause additional failures.

If firmware interface 1002 attempts to write glb_clk_enable register 1006 to stop the clocks to a logic unit which is not indicating a checkstop from checkstop_x 1016 or checkstop_y 1018, then protection logic 1008 and 1010 will not turn off the corresponding glb_clk_enable 1020 or 1022 bit, and will indicate a corresponding error 1028 or 1030 to error register 1032.

Bits set in error register 1032 cause an interrupt 1034 to be presented to the firmware. After firmware attempts writing the glb_clk_enable register 1006, it will be notified via interrupt 1034 and error register 1032 that the operation was aborted because the logic clocks were attempted to be stopped to a running functional unit which was not indicating any catastrophic failure. This indicates a likely firmware bug which incorrectly attempted to stop the clocks to the wrong functional unit. Possible follow-on firmware diagnostics are outside the scope of this application.

In an illustrative embodiment, if glb_clk_enables 1020 and 1022 are zero, indicating logic clocks are already stopped to the corresponding logic unit, then protection logic 1008 and 1010 allow a command from firmware interface 1002 to write glb_clk_enable_next 1024 and 1026 to zero or one, stop or start logic clocks, respectively. Because starting the clocks to a logic unit which is already indicating a catastrophic failure will not cause additional logic failures in an illustrative embodiment, protection is not required in that direction.

However, an alternative embodiment (not shown in FIG. 10) could easily prevent starting the clocks in response to firmware interface 1002 being set equal to one, glb_clk_enable 1020 and 1022 being set equal to zero, indicating logic clocks are already stopped to the corresponding functional units, and a catastrophic failure is indicated from the corresponding functional units by the checkstop_x 1016 or checkstop_y 1018 being set equal to one. In other words, an alternative embodiment could easily prevent starting clocks by setting the glb_clk_enable_next 1024 and 1026 equal to zero to a failed functional unit if such protection is desired.

If glb_clk_enables 1020 and 1022 are one, indicating logic clocks are already running to the corresponding logic unit, protection logic 1008 and 1010 allow a command from firmware interface 1002 to write glb_clk_enable register 1006 to a one since it will not change the state of the logic clocks to the corresponding logic unit.

Because there may be situations where it is intended to stop the clocks to a healthy functional unit, as for a re-boot of the entire computer, an illustrative embodiment implements an override (not shown in FIG. 10) where firmware can disable protection logic 1008 and 1010 to allow clocks to be stopped regardless of a checkstop from checkstop_x 1016 or checkstop_y 1018 indication. Disabling protection logic 1008 and 1010 can only be done by system control firmware, not host firmware, and requires an explicit protocol which is therefore less susceptible to firmware bugs.

Figure 11:
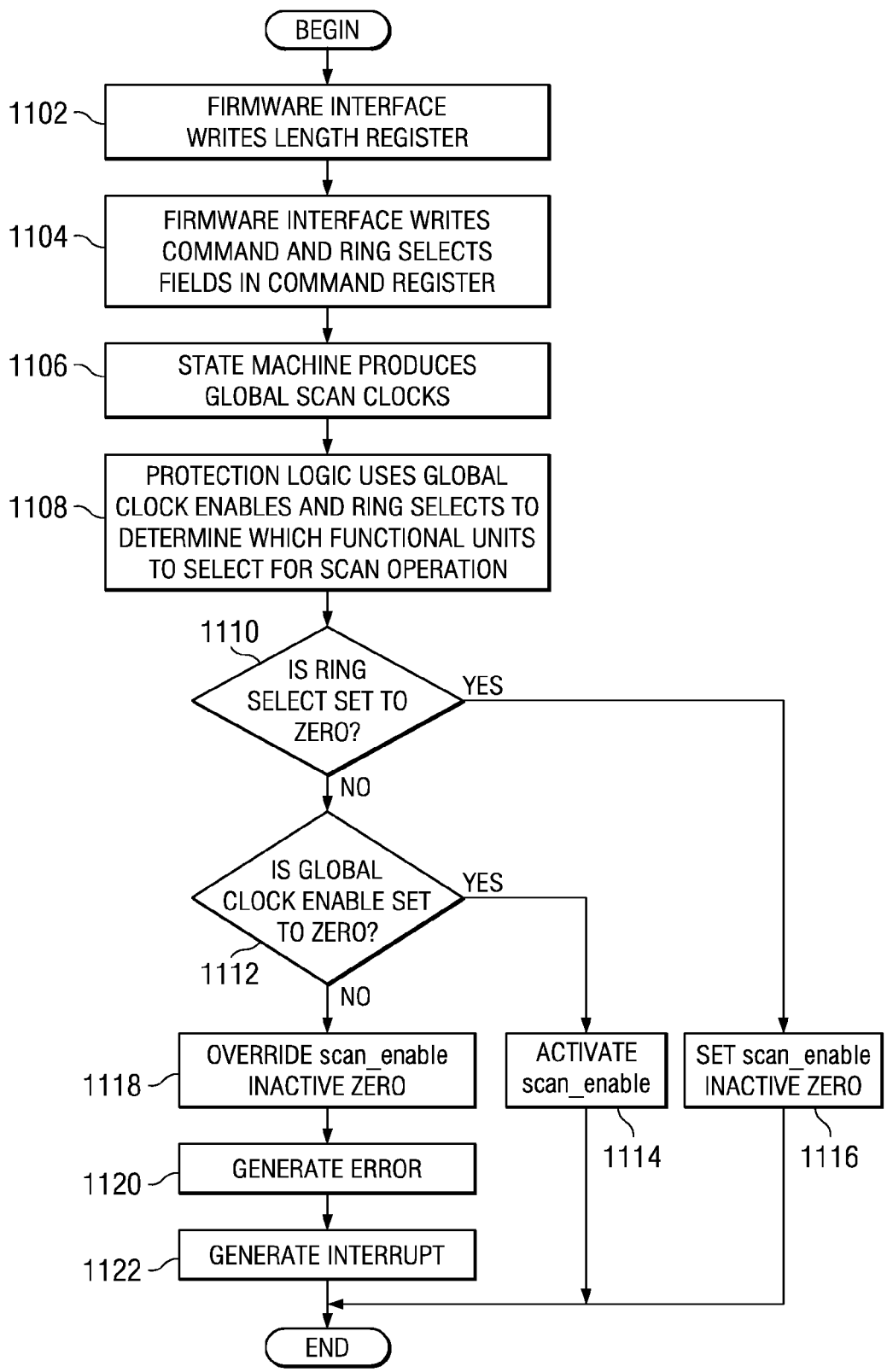
FIG. 11 illustrates a flowchart of the clock-running scan protection operation for multiple functional units in accordance with an illustrative embodiment.

FIG. 11 illustrates a flowchart of the clock-running scan protection operation for multiple functional units in accordance with an illustrative embodiment. As the operation begins, a firmware interface, such as firmware interface 446 of FIG. 4, initiates a scan operation by first writing a scan chain value to a length register, such as length register 916 in FIG. 9 (step 1102). The firmware interface then writes to a command register, such as command register 922 of FIG. 9 (step 1104). The command register contains a command field that identifies the type of scan operation, such as a read, write, start, continue, or end, and a ring selects field that identifies which scan chains will be operated on by the scan operation. A state machine, such as state machine 918 of FIG. 9, uses the scan chain value in the length register to produce the correct number of global scan clocks (step 1106) in response to the command written to the command register from step 1104.

Protection logic, such as protection logic 908 of FIG. 9, uses the global clock enable from clock control logic, such as clock control 414 of FIG. 4, and the ring selects from the command register written in step 1104 to determine whether the scan_enable signal for a particular functional unit should be activated (step 1108). The protection logic determines if the ring select is zero (step 1110). If the ring select is set to one, the protection logic determines if the global clock enable is set to zero (step 1112). If the global clock enable is set to zero then the scan_enable signal is activated by setting the scan_enable signal value to one (step 1114) with the scan operation completing and the operation terminating thereafter. The global scan clocks are gated with the scan enable signal to form local scan clocks, such as local scan clocks clka 526 and 528 and local scan clocks clkb 530 and 532 of FIG. 5.

If at step 1110, the ring select is set to zero, then the scan_enable signal is not activated (step 1116) since that chain was not selected for the scan operation, with the operation terminating thereafter. If at step 1112, the global clock enable is set to one, the protection logic forces or overrides the scan_enable signal to zero (step 1118). The protection logic generates an error bit in an error register (step 1120) that causes the scan control logic to generate an interrupt to the firmware (step 1122), with the operation terminating thereafter. When the firmware is finished with the attempted scan operation, it will be notified via the interrupt that the scan operation was aborted because the logic clocks were running to the functional unit associated with the specified ring select. This indicates a likely firmware bug which incorrectly attempted a scan operation.

FIG. 12 illustrates a flowchart of the checkstop clock-stop protection operation for multiple functional units in accordance with an illustrative embodiment. As the operation begins, the firmware interface, such as firmware interface 1002 of FIG. 10 sends a command to clock control logic, such as clock control logic 406 of FIG. 4, to start or stop the clocks to one or more logical units by writing to a global clock enable register such as global clock enable register 1006 of FIG. 10 (step 1202). Protection logic such as protection logic 1008 of FIG. 10 determines whether the values from firmware interface will be written to global clock enable register (step 1204).

The protection logic determines if the command received is an override from the system control firmware to bypass the protection logic and stop the clocks (step 1206). Because there may be situations where it is intended to stop the clocks to a healthy functional unit, as for a re-boot of the entire computer, an aspect of the operation implements an override where system control firmware may disable the protection logic to allow clocks to be stopped regardless of checkstop indication. To maintain the effectiveness of the protection logic, the override requires a specific protocol which is not prone to being done accidentally due to firmware bugs. If the command is an override from system control firmware to stop the clocks, the clocks are stopped (step 1208), with the operation terminating thereafter.

If at step 1206, the command is not an override from the system control firmware, the protection logic determines if the logic clocks are already running (step 1210). If the logic clocks are not already running and the command from the firmware interface is to either start or stop the clock, the protection logic sets the global clock enable to the appropriate state and sends the command (step 1212), with the operation terminating thereafter. Starting the clocks to a logic unit which is already indicating a catastrophic failure will not cause additional logic failures; protection is not required in that direction. If at step 1210, the logic clocks are already running, the protection logic determines if the command from the firmware interface is writing a zero (step 1214). If the command is writing a one, the command is set to start the clocks, since the start clock command will not change the state of the logic clocks (step 1216), with the operation terminating theraftrer.

If at step 1214, the command from the firmware interface is writing a zero, then a determination is made as to whether the checkstop is set to one (step 1218). If the checkstop is set to one, then the clocks are stopped (step 1220), with the operation terminating thereafter. If at step 1218, the checkstop is set to zero, the command from the firmware interface to stop the clocks is ignored (step 1222). Then an error is sent to the error register (step 1224) and the protection logic generates an interrupt to the firmware interface (step 1226), with the operation terminating thereafter.

Thus, the illustrative embodiments provide a computer implemented method and data processing system to prevent firmware defects from disturbing logic clocks in a multi-core microprocessor chip to improve system reliability. First Failure Data Capture (FFDC) data is collected from failed components for diagnostics, which requires stopping logic clocks and extracting latch contents via LSSD scanning, while the remaining operational components in the system remain running. The clock control logic and scan control logic are distributed across all the chips in the system, each with a memory mapped register interface which is manipulated by system control firmware. Checkstop indications from each logical clock domain to the clock run control logic gate whether updates from system control firmware are honored to stop logical clock domains or not. Clock running status is indicated to the scan control logic for each logical clock domain to gate whether firmware access is granted to the scan chains or not. Incorrect firmware actions which would potentially interrupt a running logic domain are detected, the actions blocked, and an interrupt reported back to system control firmware with status indicating a violation.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method of preventing firmware defects from disturbing logic clocks, the computer implemented method comprising: receiving a request for a scan operation from a firmware interface for a functional unit, wherein the request includes a scan chain length value and a ring select; producing global scan clocks using the scan chain length value; and responsive to the ring select being set equal to a ring select value of one and a global clock enable value being set equal to zero, setting the value of a scan enable signal equal to one, wherein the global scan clocks are gated with the scan enable signal to form local scan clocks; responsive to the ring select value being set to one and the global clock enable value being set equal to one, setting the value of a scan enable signal equal to zero; generating an error in a register; and generating an interrrupt to the firmware interface.

2. The computer implemented method of claim 1, further comprising:
responsive to the ring select value being set equal to zero, setting the value of the scan enable signal equal to zero.

3. The computer implemented method of claim 1, wherein the request is a plurality of requests for a plurality of functional units and wherein each request within the plurality of requests is addressed independently for each functional unit within the plurality of functional units.

4. A data processing system comprising: a bus system; a communications system connected to the bus system; a memory connected to the bus system, wherein the memory includes a set of instructions; and a processing unit connected to the bus system, wherein the processing unit executes the set of instructions to receive a request for a scan operation from a firmware interface for a functional unit, wherein the request includes a scan chain length value and a ring select; produce global scan clocks using the scan chain length value; and set the value of a scan enable signal equal to one in response to the ring select being set equal to a ring select value of one and a global clock enable value being set equal to zero, wherein the global scan clocks are gated with the scan enable signal to form local scan clocks, wherein the data processing system executes further instructions to set the value of a scan enable signal equal to zero; generating an error in a register in response to the ring select value being set to one and the global clock enable value being set equal to one; and generate an interrupt to the firmware interface.

5. The data processing system of claim 4, wherein the data processing system executes further instructions to set the value of the scan enable signal equal to zero in response to the ring select value being set equal to zero.

6. The data processing system of claim 4, wherein the request is a plurality of requests for a plurality of functional of requests is addressed independently for each functional unit within the plurality of functional units.

* * * * *